United States Patent
Takahashi

(10) Patent No.: US 11,852,702 B2
(45) Date of Patent: Dec. 26, 2023

(54) MAGNETIC RESONANCE MEASUREMENT APPARATUS

(71) Applicant: RIKEN, Wako (JP)

(72) Inventor: Masato Takahashi, Wako (JP)

(73) Assignee: RIKEN, Wako (JP)

( * ) Notice: Subject to any disclaimer, the term of this patent is extended or adjusted under 35 U.S.C. 154(b) by 26 days.

(21) Appl. No.: 17/275,605

(22) PCT Filed: Sep. 10, 2019

(86) PCT No.: PCT/JP2019/035446
§ 371 (c)(1),
(2) Date: Mar. 11, 2021

(87) PCT Pub. No.: WO2020/054686
PCT Pub. Date: Mar. 19, 2020

(65) Prior Publication Data
US 2022/0050157 A1 Feb. 17, 2022

(30) Foreign Application Priority Data

Sep. 13, 2018 (JP) ................................. 2018-171745

(51) Int. Cl.
*G01R 33/36* (2006.01)
*G01R 33/34* (2006.01)

(52) U.S. Cl.
CPC ... *G01R 33/3671* (2013.01); *G01R 33/34092* (2013.01); *G01R 33/3657* (2013.01)

(58) Field of Classification Search
CPC .......... G01R 33/34092; G01R 33/3657; G01R 33/3671
See application file for complete search history.

(56) References Cited

U.S. PATENT DOCUMENTS

| 4,620,155 A | 10/1986 | Edelstein |
| 4,649,348 A | 3/1987 | Flugan |

(Continued)

FOREIGN PATENT DOCUMENTS

| CN | 103257331 A | 8/2013 |
| JP | 63-117745 A | 5/1988 |

(Continued)

OTHER PUBLICATIONS

Bendall et al., "Elimination of Coupling between Cylindrical Transmit Coils and Surface-Receive Coils for in Vivo NMR", Magnetic Resonance in Medicine 3, pp. 157-163 (1986).

(Continued)

*Primary Examiner* — Gregory H Curran
(74) *Attorney, Agent, or Firm* — Birch, Stewart, Kolasch & Birch, LLP

(57) ABSTRACT

A magnetic resonance measurement apparatus according to the present invention includes a first LC circuit that forms an oscillating magnetic field that causes an object to exhibit magnetic resonance. The first LC circuit includes a parallel connection assembly including a diode. The parallel connection assembly further includes a diode connected, in parallel and in reverse direction, to the diode, or an inductor connected in parallel to the diode. In a first state in which oscillating voltage for forming the oscillating magnetic field is applied to the first LC circuit, the diode of the parallel connection assembly functions as a short-circuit such that the resonance frequency of the first LC circuit becomes a first resonance frequency. In a second state in which oscillating voltage is not applied to the first LC circuit, the diode of the parallel connection assembly functions as capacitance such that the resonance frequency of the first LC circuit becomes a second resonance frequency that is different from the first resonance frequency.

19 Claims, 17 Drawing Sheets

(56) References Cited

U.S. PATENT DOCUMENTS

| | | | |
|---|---|---|---|
| 4,725,779 A | 2/1988 | Hyde et al. | |
| 5,221,902 A | 6/1993 | Jones et al. | |
| 6,291,994 B1* | 9/2001 | Kim .................... | G01R 33/441 |
| | | | 324/318 |
| 6,956,370 B2 | 10/2005 | Heidler | |
| 7,388,377 B2 | 6/2008 | Alvarez et al. | |
| 7,710,116 B2 | 5/2010 | Schiano et al. | |
| 2003/0080801 A1 | 5/2003 | Viti | |
| 2005/0030029 A1* | 2/2005 | Sauer .................... | G01R 33/441 |
| | | | 324/318 |
| 2005/0127914 A1 | 6/2005 | Eberler et al. | |
| 2006/0119357 A1 | 6/2006 | Alvarez et al. | |
| 2008/0061786 A1 | 3/2008 | Fukuda et al. | |
| 2017/0256989 A1* | 9/2017 | Yoshii .................. | H02M 3/335 |
| 2018/0074140 A1 | 3/2018 | Yang et al. | |

FOREIGN PATENT DOCUMENTS

| | | |
|---|---|---|
| JP | 2-261428 A | 10/1990 |
| JP | 5-84228 A | 4/1993 |
| JP | 6-142076 A | 5/1994 |
| JP | 2007-322361 A | 12/2007 |

OTHER PUBLICATIONS

Brunner et al., "Symmetrically biased T/R switches for NMR and MRI with microsecond dead time", Journal of Magnetic Resonance 263 (2016), pp. 147-155.

Dong et al., "Suppression of ringing in the tuned input circuit of a Squid detector used in low-field NMR measurements", Superconductor Science and Technology 22 (2009), pp. 1-7.

International Search Report for PCT/JP2019/035446 (PCT/ISA/210) dated Dec. 17, 2019.

Peshkovsky et al., "RF probe recovery time reduction with a novel active ringing suppression circuit", Journal of Magnetic Resonance 177 (2005), pp. 67-73.

Written Opinion of International Searching Authority for PCT/JP2019/035446 (PCT/ISA/237) dated Dec. 17, 2019.

Duraiswamy et al., "Switching Circuit for RF Coil Ring-down Time Reduction in Pulsed EPR Spectrometer," 2015 IEEE International Microwave and RF Conference (IMaRC), Dec. 10, 2015, pp. 396-399.

Extended European Search Report for corresponding European Application No. 19860487.8, dated May 11, 2022.

Japanese Notice of Reasons for Refusal for Japanese Application No. 2018-171745, dated Jan. 10, 2023, with English translation.

\* cited by examiner

[Fig. 1]
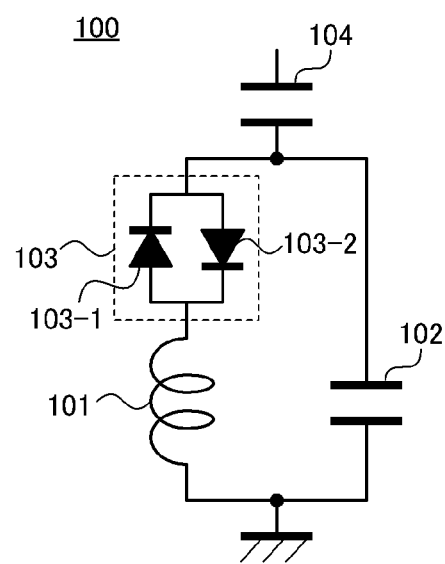

[Fig. 2]
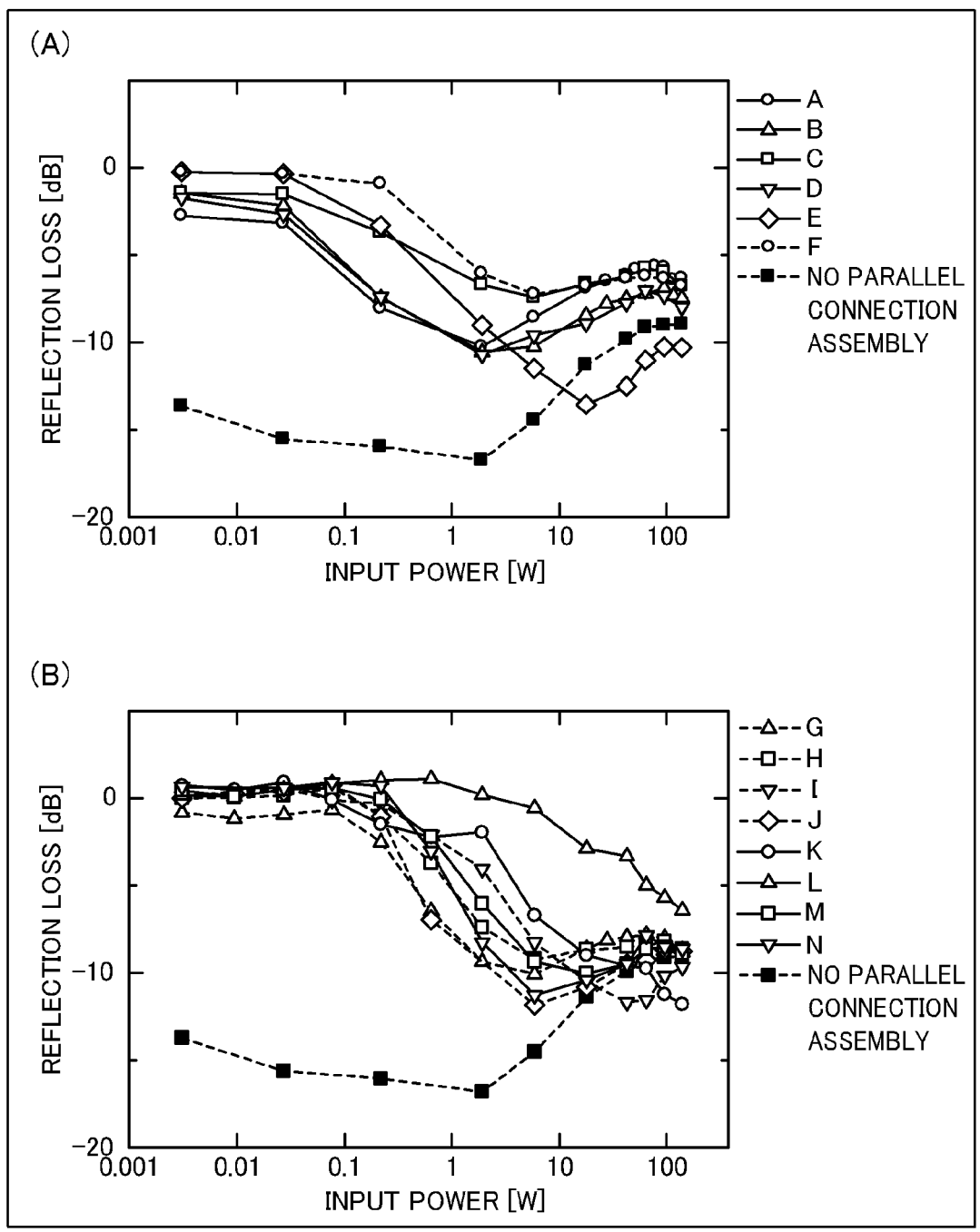

[Fig. 3A]

| | Manufacturer | Manufacturer Part Number | Material | Continuous Forward Current IF [A] | Forward Voltage VF [V] | DC Blocking Voltage VR [V] | Total Capative Charge QC [nC] | Junction Capacitance CJ@1V [pF] |
|---|---|---|---|---|---|---|---|---|
| DIODE A | ON Semiconductor | MBRA340T3G | Silicon | 3 | 0.45 | 40 | — | 800 |
| DIODE B | ON Semiconductor | MBRA140T3G | Silicon | 1 | 0.55 | 40 | — | 100 |
| DIODE C | PANJIT Semiconductor | MS110F | Silicon | 1 | 0.8 | 100 | — | 65 |
| DIODE D | PANJIT Semiconductor | SS2040FL | Silicon | 2 | 0.4 | 40 | — | 200 |
| DIODE E | Micro Commercial Components | SS1200 | Silicon | 1 | 0.92 | 200 | — | 220 |
| DIODE F | GeneSiC Semiconductor | GB01SLT06-214 | SiC | 1 | 1.5 | 650 | 7 | 76 |

[Fig. 3B]

| | Manufacturer | Manufacturer Part Number | Type | Arrangement | Material | Continuous Forward Current IF [A] | Forward Voltage VF [V] | DC Blocking Voltage VR [V] | Total Capative Charge QC [nC] | Diode Capacitance C [pF] | reverse recovery time trr [ns] | carrier lifetime τ [ns] |
|---|---|---|---|---|---|---|---|---|---|---|---|---|
| PARALLEL CONNECTION ASSEMBLY G | nexperia | BAV99 | Fast recovery | Antiparallel +47pF | Silicon | 0.215 | 1.25 | 100 | — | 1.5 | 4 | — |
| PARALLEL CONNECTION ASSEMBLY H | infineon | BAS21 | Fast recovery | Antiparallel +47pF | Silicon | 0.25 | 1.25 | 250 | — | 5 | 50 | — |
| PARALLEL CONNECTION ASSEMBLY I | ROHM | 1SR154-400 | Fast recovery | Antiparallel +47pF | Silicon | 1 | 1.1 | 400 | — | 25 | 1600 | — |
| PARALLEL CONNECTION ASSEMBLY J | NXP Semiconductors | BAP64-02 | PIN | Antiparallel +47pF | Silicon | 0.1 | 1.1 | 175 | — | 0.48 | — | 1550 |
| PARALLEL CONNECTION ASSEMBLY K | Skyworks Solutions | SKY16602 -632LF | Schottky +PIN | Antiparallel +47pF | Silicon | — | — | — | — | — | — | — |
| PARALLEL CONNECTION ASSEMBLY L | Micro Commercial Components | SS1200 | Schottky | Single +120nH | Silicon | 1 | 0.92 | 200 | — | 220 | — | — |
| PARALLEL CONNECTION ASSEMBLY M | nexperia | BAV70 | Fast recovery | Single +120nH | Silicon | 0.215 | 1.25 | 100 | — | 1.5 | 4 | — |
| PARALLEL CONNECTION ASSEMBLY N | NXP Semiconductors | BAP64-02 | PIN | Single +120nH | Silicon | 0.1 | 1.1 | 175 | — | 0.48 | — | 1550 |

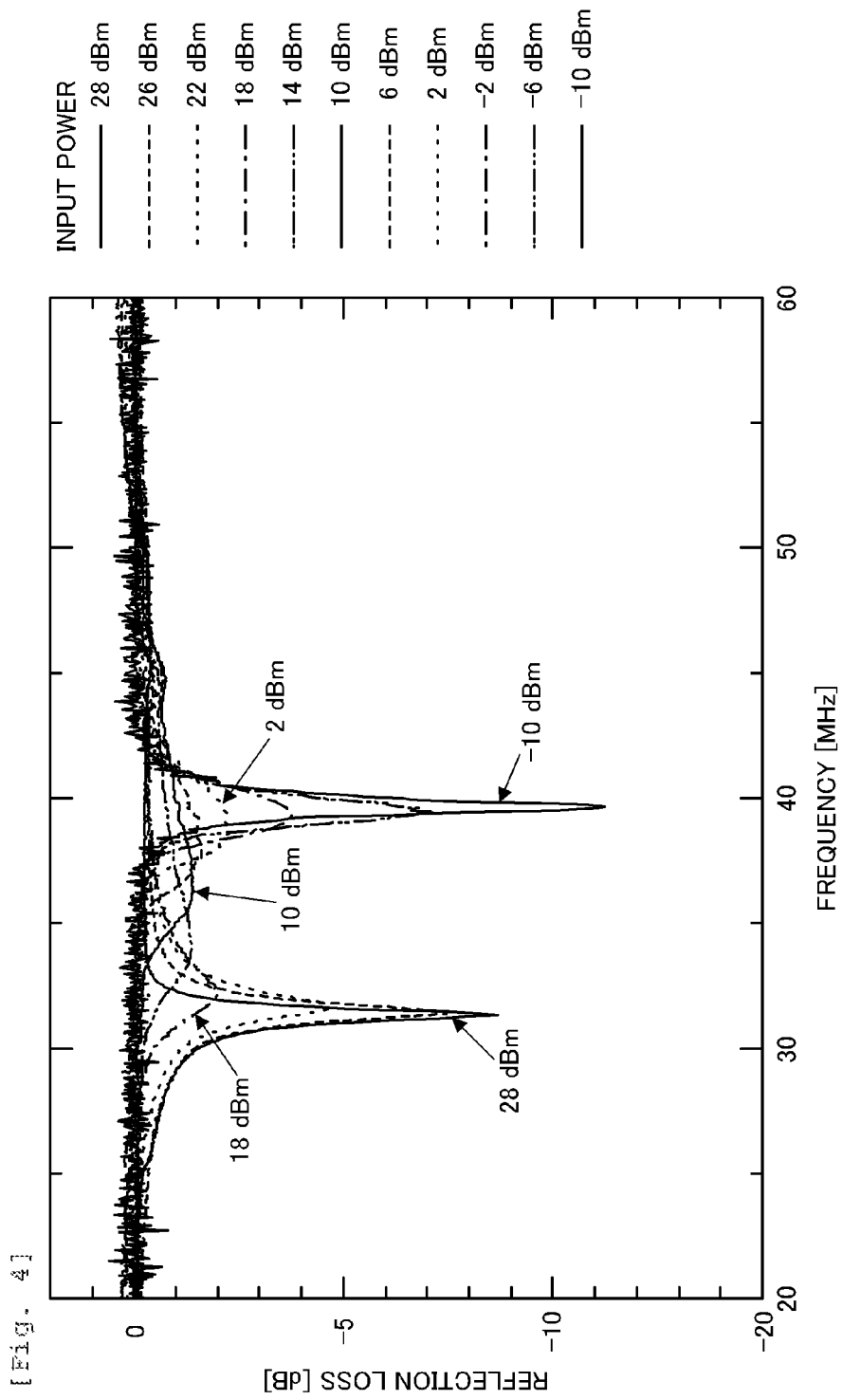

[Fig. 5]
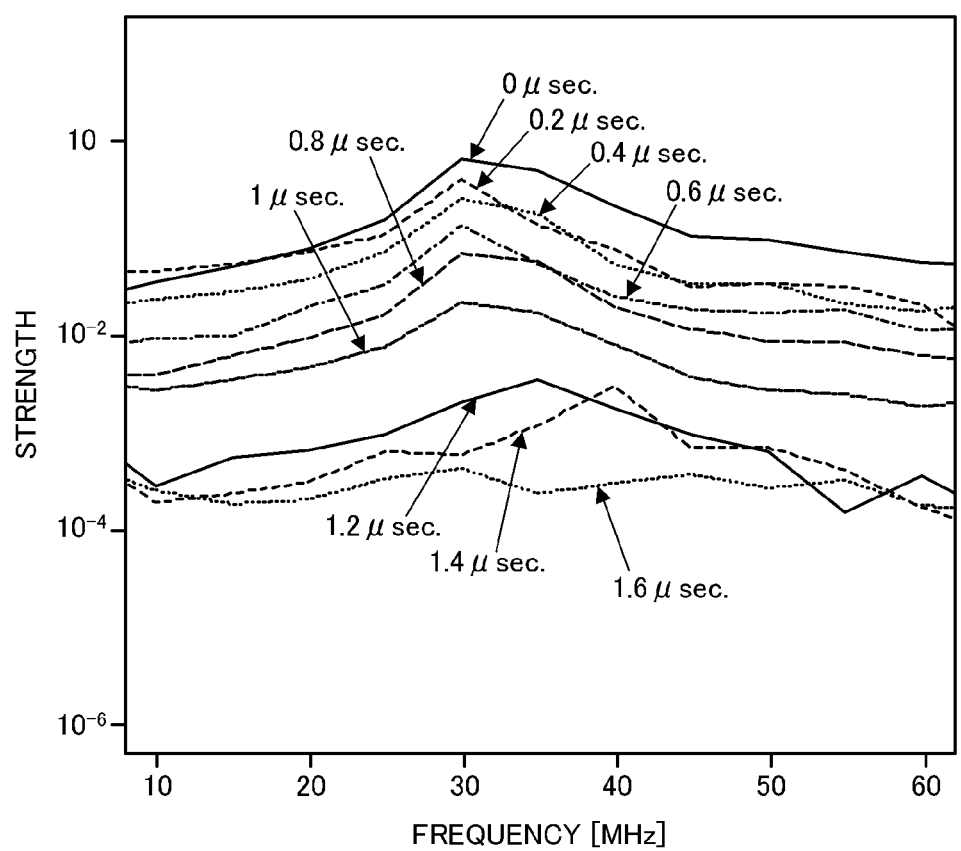

[Fig. 6]
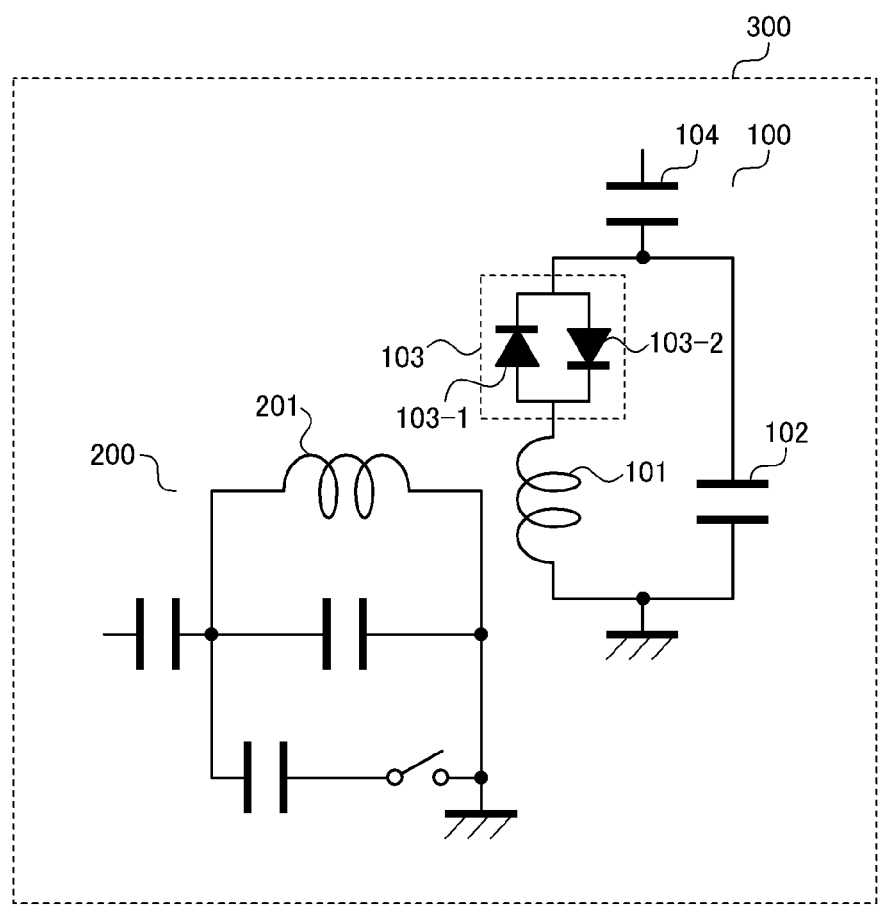

[Fig. 7]
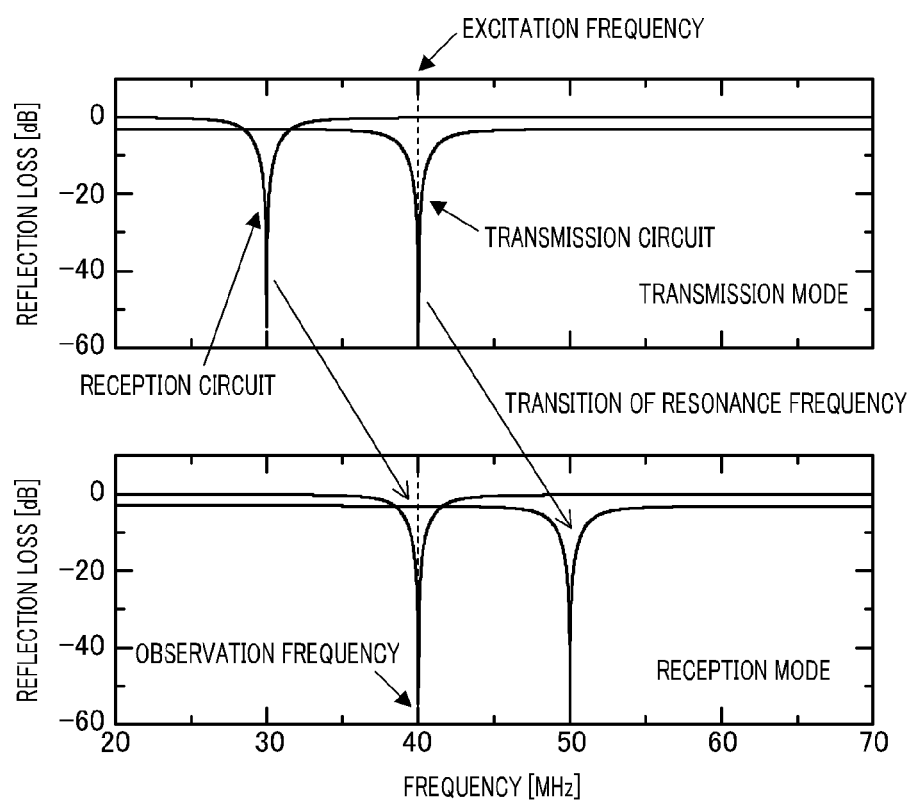

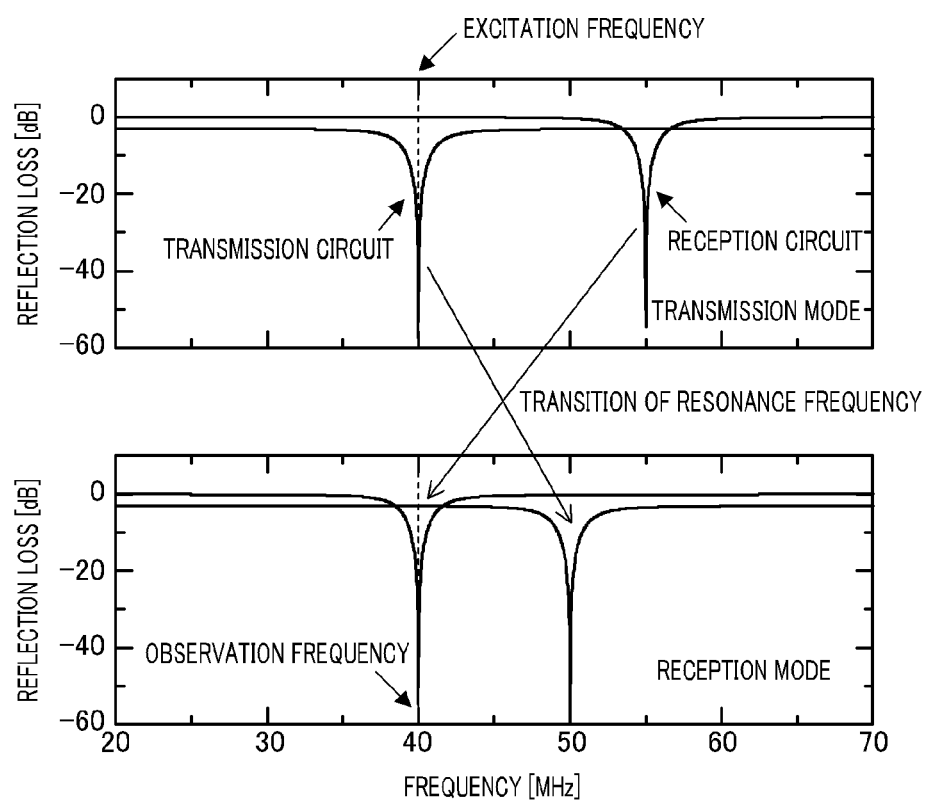
[Fig. 8]

[Fig. 9]
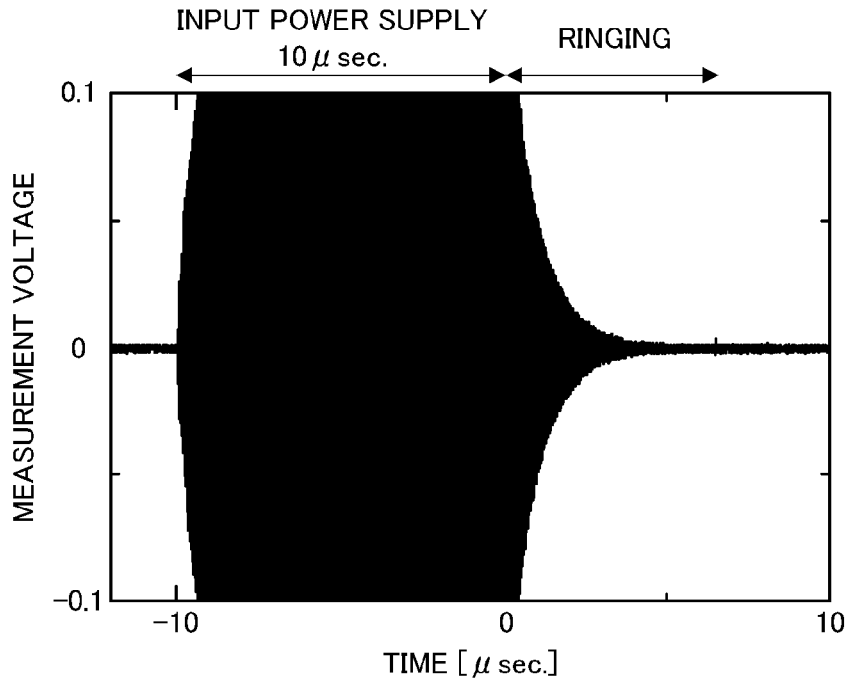
[Fig. 10]
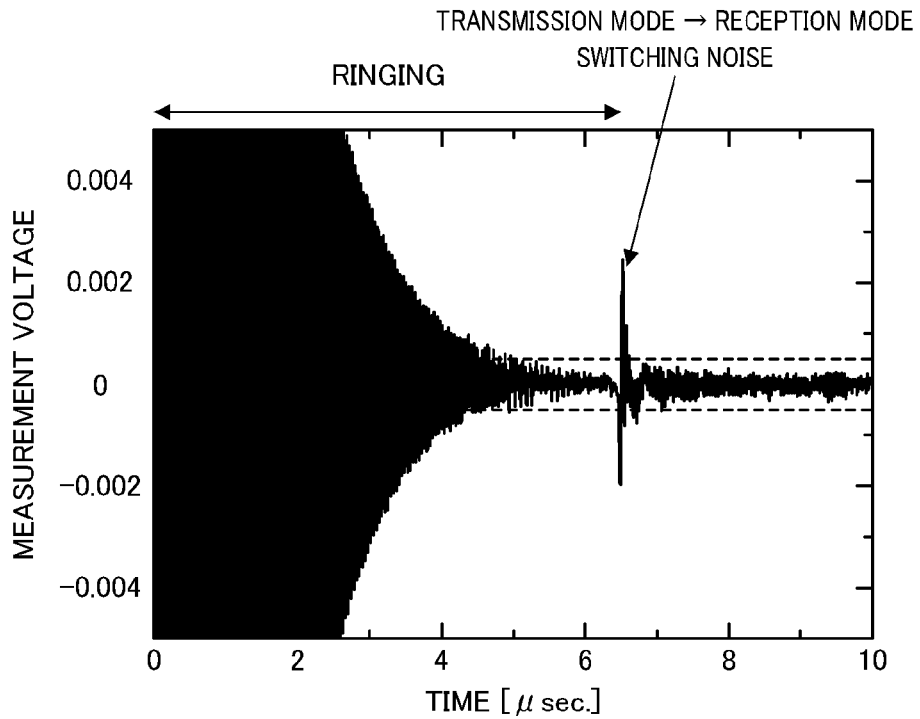

[Fig. 11]
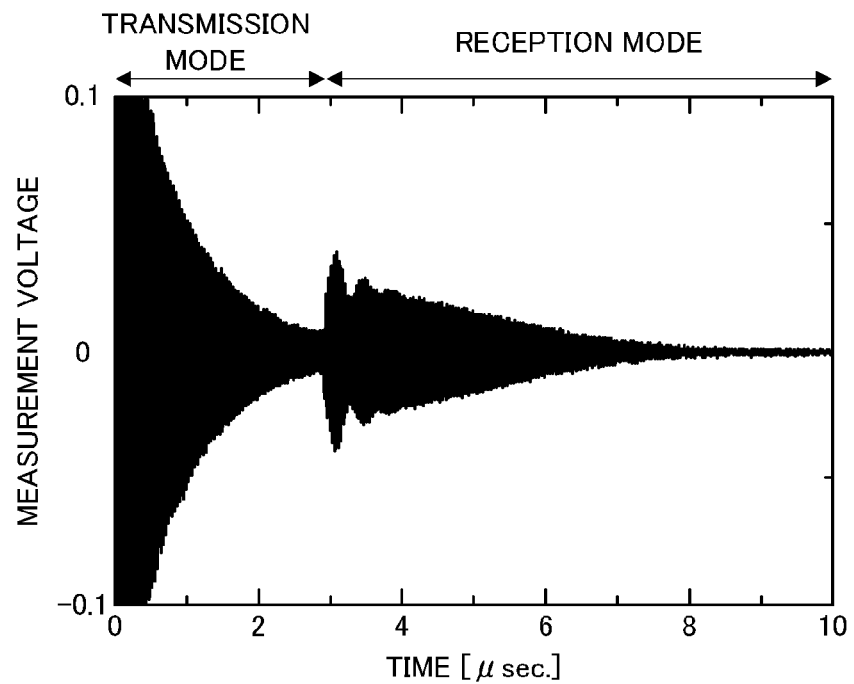
[Fig. 12]
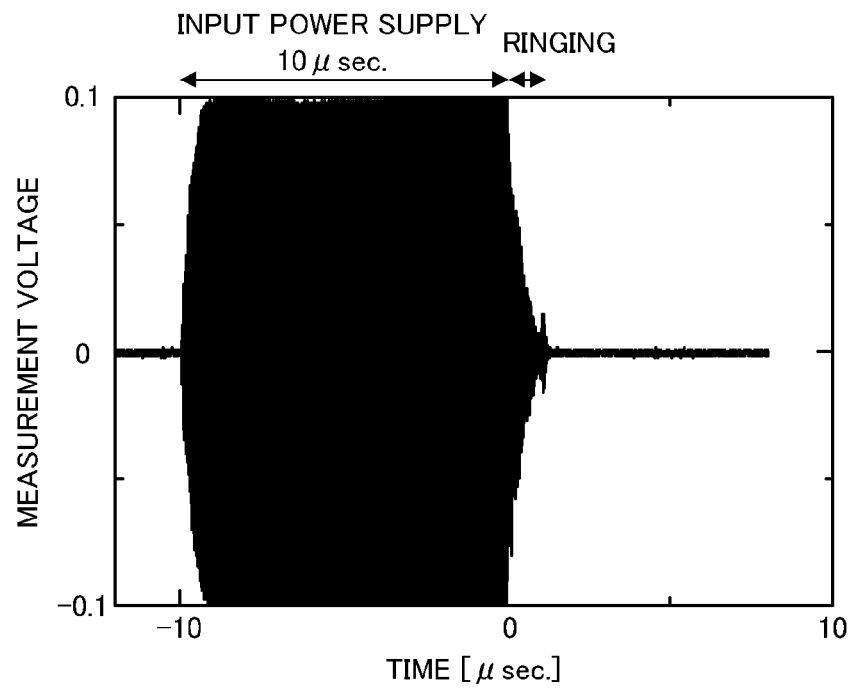

[Fig. 13]
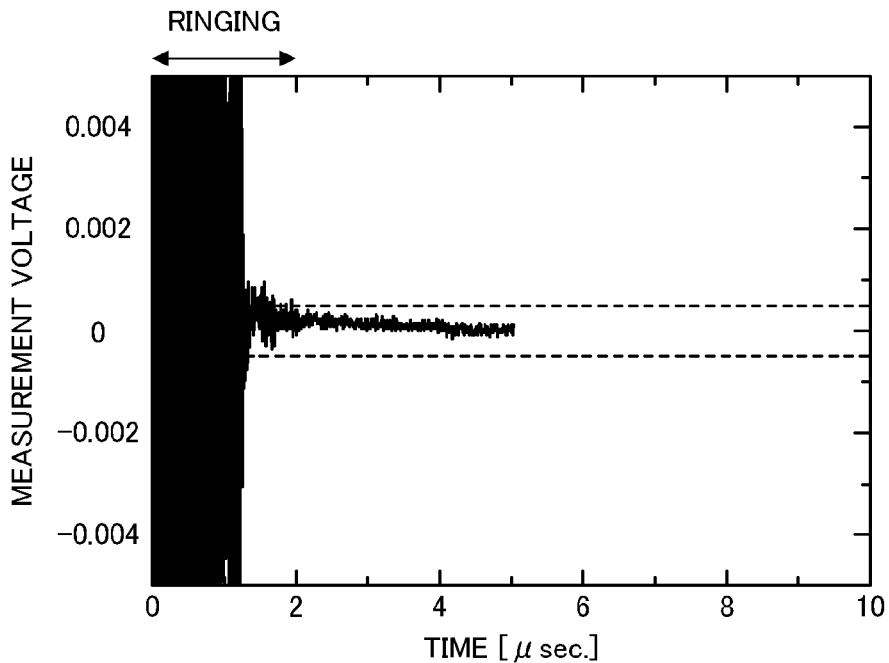
[Fig. 14]
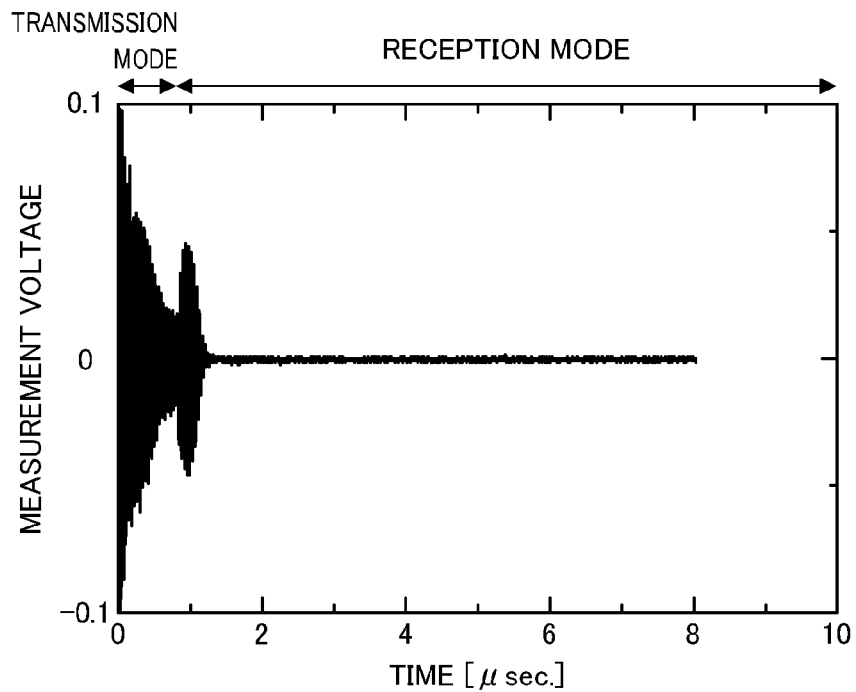

[Fig. 15]
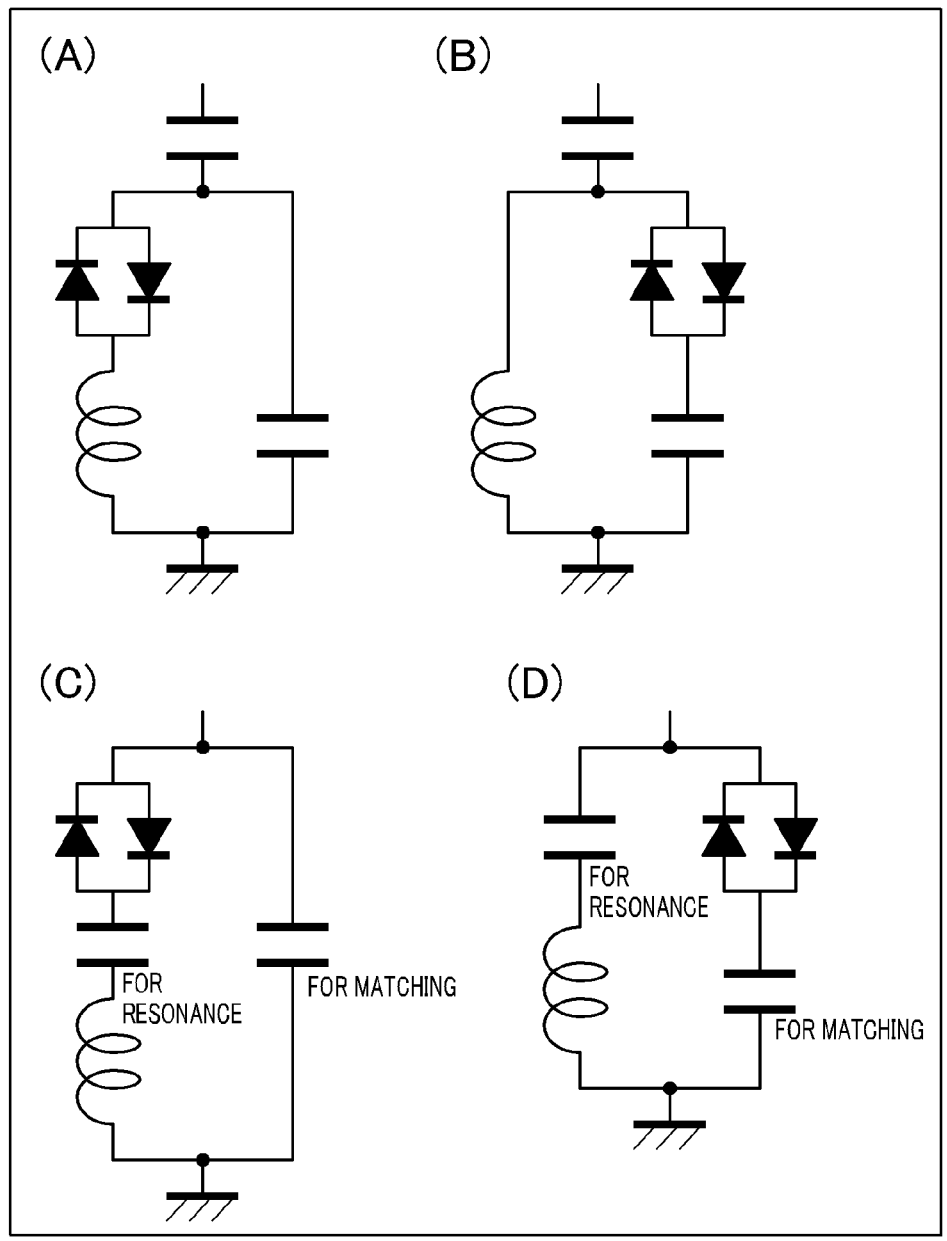

[Fig. 16]
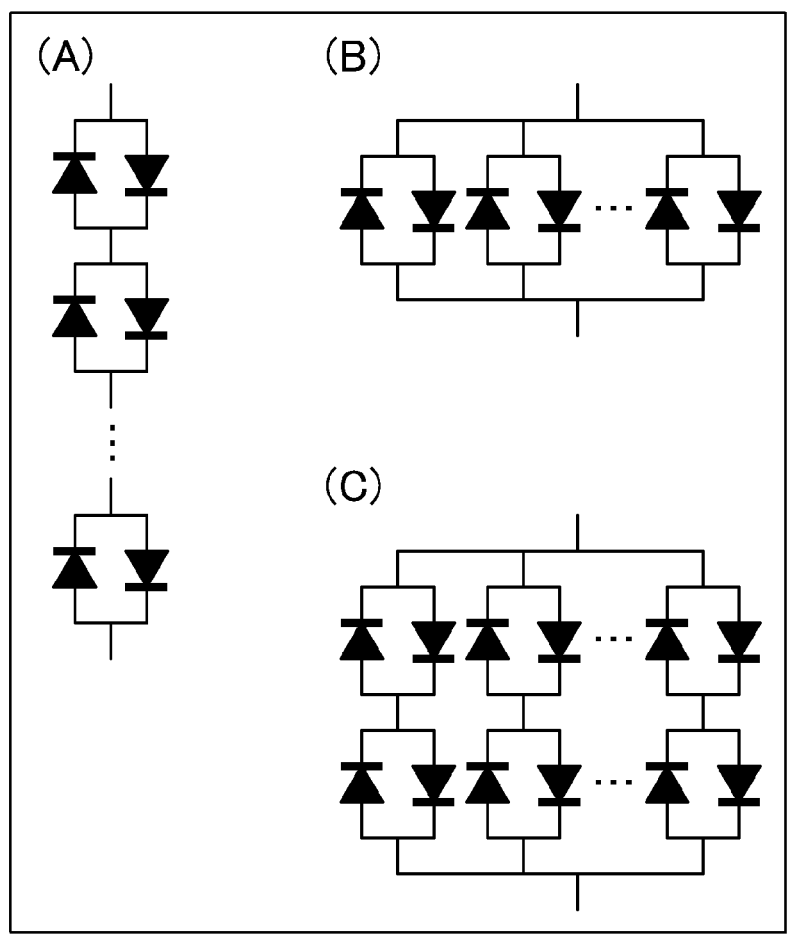

[Fig. 17]
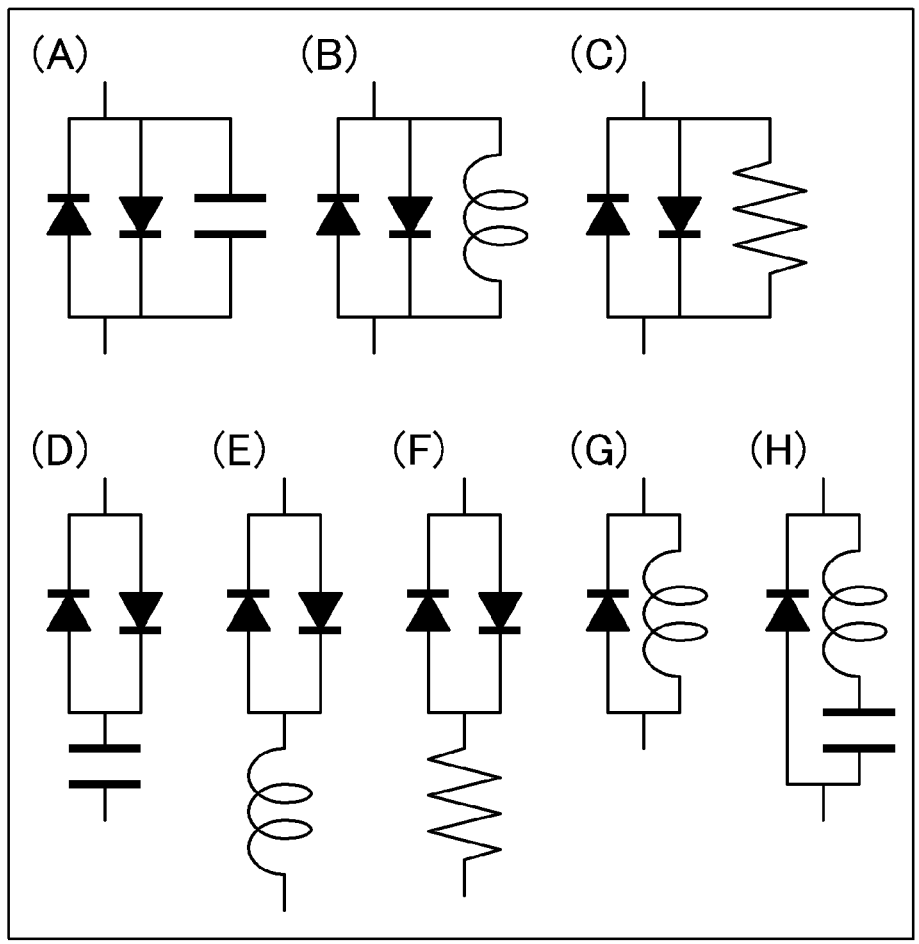
[Fig. 18]
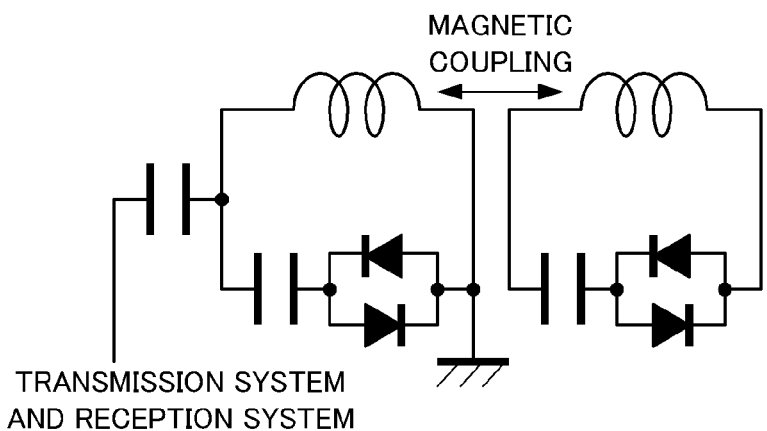

[Fig. 19]
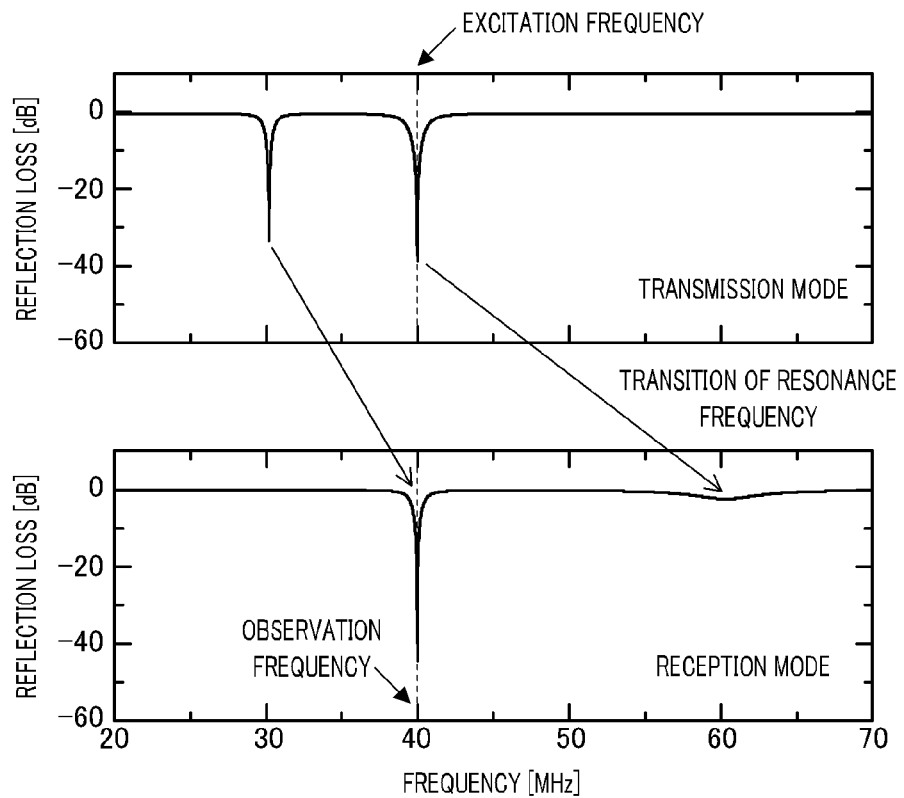
[Fig. 20]
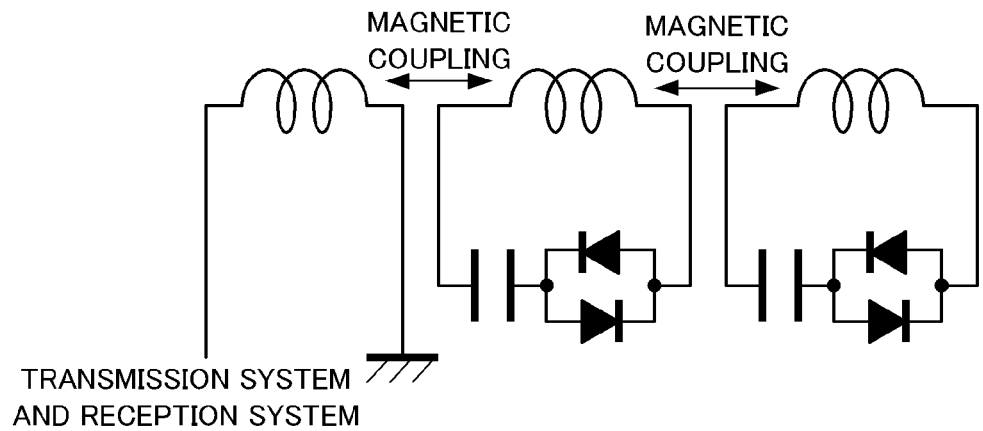

[Fig. 21]
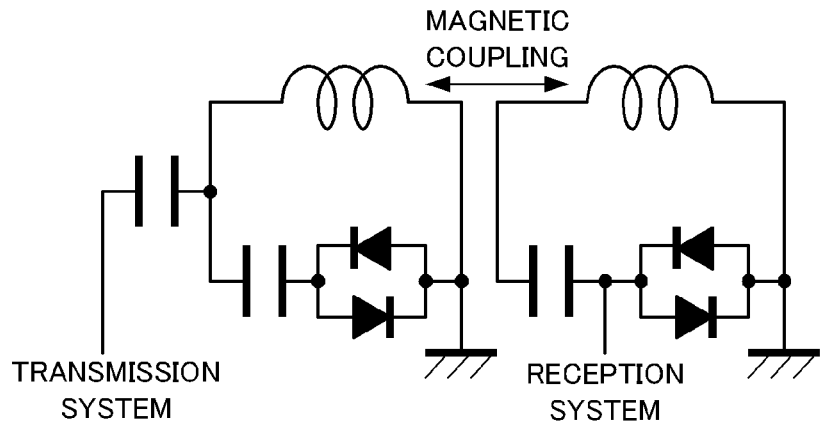
[Fig. 22]
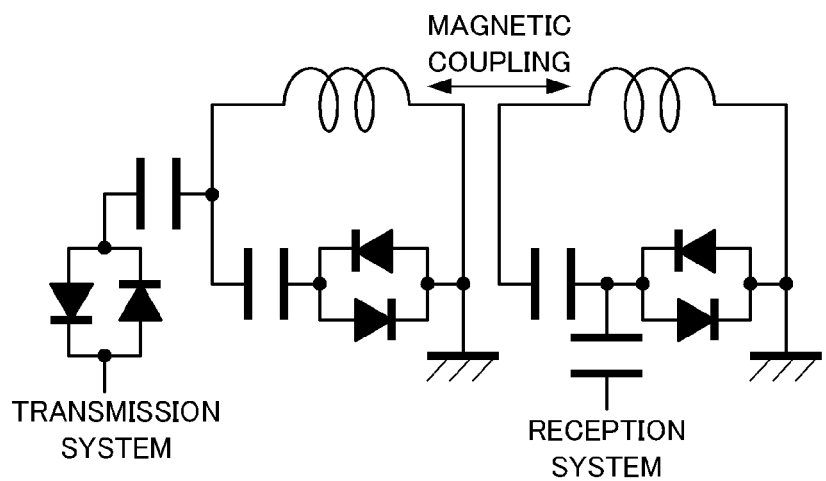
[Fig. 23]
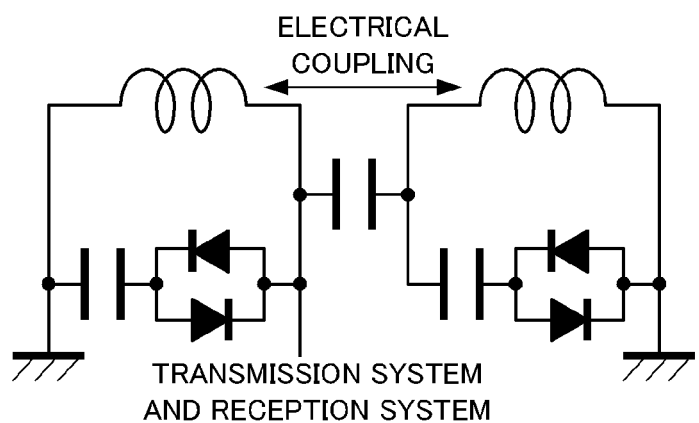

MAGNETIC RESONANCE MEASUREMENT APPARATUS

TECHNICAL FIELD

The present invention relates to a magnetic resonance measurement apparatus.

BACKGROUND ART

NMR (Nuclear Magnetic Resonance) apparatuses, MRI (Magnetic Resonance Imaging) apparatuses, and so forth, are known as magnetic resonance measurement apparatuses. Both NMR apparatuses and MRI apparatuses irradiate a measurement object in a magnetic field with excitation signals (oscillating magnetic field (high-frequency magnetic field) or electromagnetic waves generated by an oscillating magnetic field), and receive response signals emitted from nuclear spin excited by the excitation signals (oscillating magnetic field (high-frequency magnetic field) or electromagnetic waves generated by the oscillating magnetic field; resonance signals; NMR signals) within the measurement object, thereby performing measurement. Note that although the frequency of the excitation signals and the frequency of the response signals are the same, the difference between the strength of excitation signals and the strength of response signals is great. Specifically, while the strength of excitation signals is 100 W or greater, the strength of response signals is around 1 femtowatt. That is to say, the strength of excitation signals relative to the strength of response signals is approximately $10^{10}$ times to $10^{17}$ times, although this depends on the measurement object. Accordingly, pulse NMR apparatuses such as FT-NMR apparatuses and TD-NMR apparatuses are configured to switch the operation mode from a transmission mode, in which excitation signals are transmitted, to a reception mode, in which reception signals are received, at a suitable timing.

Although NMR apparatuses have been developed, mainly with regard to solution-state NMR apparatuses that measure liquids, solid-state NMR apparatuses that measure solids such as powders and so forth have rapidly been developed in recent years. As a result, measurement methods that enable measurements of objects that heretofore were impossible to measure have been developed, and thus NMR apparatuses have come to be applied to not only chemistry and life sciences, but also to material development and so forth as well. The difference between solution-state NMR apparatuses and solid-state NMR apparatuses lies, for example, in the duration of time over which response signals are present Specifically, with solution-state NMR apparatuses, response signals (response signals emitted from the liquid that is an object of measurement) normally are present for one second or longer after excitation, but with solid-state NMR apparatuses, response signals (response signals emitted from the solid that is an object of measurement) are only present for a few milliseconds or less after excitation. Accordingly, switching from the transmission mode to the reception mode needs to be performed quicker with solid-state NMR apparatuses than with solution-state NMR apparatuses.

LC circuits (resonant circuit; LC resonant circuit) are used as antennas for transmission/reception of signals (excitation signals and response signals), in order to efficiently cause excitation of nuclear spin and efficiently receive response signals. Using LC circuits enables excitation of nuclear spin and reception of response signals to be performed with a round ten times the efficiency as compared to a case of not using LC circuits, and accordingly LC circuits are indispensable circuits for magnetic resonance measurement apparatuses.

Technology regarding magnetic resonance measurement apparatuses is disclosed in, for example, PTL 1 to 7 and NPL 1 to 4.

CITATION LIST

Patent Literature

[PTL 1]
  U.S. Pat. No. 4,620,155 Specification
[PTL 2]
  U.S. Pat. No. 4,725,779 Specification
[PTL 3]
  U.S. Pat. No. 5,221,902 Specification
[PTL 4]
  U.S. Pat. No. 6,956,370 Specification
[PTL 5]
  US Patent Application Publication No. 2006/0119357 Specification
[PTL 6]
  U.S. Pat. No. 7,388,377 Specification)
[PTL 7]
  U.S. Pat. No. 7,710,116 Specification)

Non Patent Literature

[NPL 1]
  M. Robin Bendall, Alan Connelly, and Jamie M. McKendry, Elimination of Coupling between Cylindrical Transmit Coils and Surface-Receive Coils for in Vivo NMR, MAGNETIC RESONANCE IN MEDICINE 3, 157-163 (1986)
[NPL 2]
  A. S. Peshkovsky, J. Forguez, L. Cerioni, D. J. Pusiol, RF probe recovery time reduction with a novel active ringing suppression circuit, Journal of Magnetic Resonance 177 (2005) 67-73
[NPL 3]
  Hui Dong, Yi Zhang, Hans-Joachim Krause, Xiaoming Xie, Alex I Braginski and Andreas Offenhausser, Suppression of ringing in the tuned input circuit of a SQUID detector used in low-field NMR measurements, Supercond. Sci. Technol. 22 (2009) 125022 (7pp)
[NPL 4]
  David O. Brunner, Lukas Furrer, Markus Weiger, Werner Baumberger, Thomas Schmid, Jonas Reber, Benjamin E. Dietrich, Bertram J. Wilm, Romain Froidevaux, Klaas P. Pruessmann, Symmetrically biased T/R switches for NMR and MRI with microsecond dead time, Journal of Magnetic Resonance 263 (2016) 147-155

SUMMARY OF INVENTION

Technical Problem

However, although efficiency can be raised with LC circuits by accumulating energy of signals (excitation signals and response signals) within the LC circuits, the accumulated energy does not disappear immediately, but gradually decays. Accordingly, after switching from the transmission mode to the reception mode, the total energy of energy accumulated in the transmission mode (transmission energy; energy of excitation signals) and energy newly accumulated in the reception mode (reception energy;

energy of response signals) is measured. This state continues until the transmission energy is gone. At the time of switching from the transmission mode to the reception mode, the strength of the transmission energy is vastly greater than the strength of the reception energy. Accordingly, a state, in which the reception energy is hidden by the transmission energy and the reception energy cannot be measured at all or cannot be measured with high precision, continues for a while. In the technical field of magnetic resonance measurement apparatuses, the state in which the transmission energy gradually decays is referred to as "ringing" and so forth, and the time during which ringing continues and high-precision measurement cannot be performed is referred to as "dead time" and so forth.

In solution-state NMR apparatuses, the response signals are present for one second or longer, high-precision measurement can be performed since the response signals remain even after waiting for ringing to end. Conversely, in solid-state NMR apparatuses, the response signals are present only for a few milliseconds or less, and accordingly the strength of the response signals are extremely weak if waiting for ringing to end, and the response signals cannot be measured with high precision. Thus, ringing impedes development of solid-state NMR apparatuses. How long a duration is set for the dead time is extremely important in solid-state NMR measurement. If the dead time is long, the response signals, which are to be measured, decay and are lost during ringing, and if too short, the response signals are obstructed by ringing and cannot be measured. The transmission energy during ringing is vastly greater than the reception energy, and accordingly if the voltage measurement range is set to meet nuclear magnetic resonance signals (response signals) that are extremely faint, the measurement value may be an off-scale high from a measurement range and cannot be measured. Conversely, if the measurement range is set to meet the excitation signals, the faint response signals are coarsely converted at the time of quantization in A/D conversion, and cannot be measured with high precision.

Now, an NMR probe called a "CryoMAS probe" has been proposed. With the CryoMAS probe, an antenna that transmits/receives signals (excitation signals and response signals) is cooled, thereby reducing the electrical resistance of the antenna, and sensitivity of transmission/reception can be raised. However, in LC circuits the higher the sensitivity of transmission/reception (high Q factor) is, the longer the dead time from ringing is. Moreover, with the CryoMAS probe, there is a need to wait for ringing to end, and dead time is long. Accordingly, signals that are decayed even further are measured, despite being able to measure with high sensitivity. Accordingly, in solid-state NMR apparatuses the performance of the CryoMAS probe cannot be put to effective use.

The EASY method has been proposed as a method for removing the transmission energy (ringing component) from the total energy of the transmission energy and the reception energy. The EASY method pays attention to a state in which the nuclear spin that is the object of measurement exhibits transverse relaxation following excitation whereby no nuclear magnetic resonance signals are generated even if excitation signals are re-transmitted. The effects of ringing can be removed by subtracting signals containing primarily the ringing component of the retransmitted excitation signals from the signals containing both the nuclear magnetic resonance signals and the ringing component obtained by performing normal measurement. However, it is impossible to completely remove only the ringing component due to measurement values containing error or due to slight differences of state remaining. This is due to the extremely great difference in strength between the excitation signals and the response signals, as described above. Further, the measurement range needs to be set to meet the signal level of the ringing component, and accordingly highly precise measurement cannot be performed. Further, noise is added at the time of calculating the difference between the two measurement values, and accordingly the S/N ratio (sensitivity) deteriorates.

A Q-switching method (Q-damping method) has been proposed as a method for shortening, by hardware, dead time from ringing. In the Q-switching method, the Q factor that indicates the performance of the LC circuit is temporarily lowered, deteriorating temporarily the performance of the LC circuit, and the dead time is shortened. However, a complex circuit is necessary in order to apply the Q-switching method. Further, lowering the Q factor deteriorates the performance of the LC circuit, and accordingly response signals cannot be measured with high precision.

Accordingly, the present invention provides a magnetic resonance measurement apparatus that has a simple configuration and that can measure response signals with high precision.

Solution to Problem

In order to achieve the above object, a method, in which a parallel connection assembly including a diode is used, is employed in the present invention.

Specifically, a magnetic resonance measurement apparatus according to the present invention includes a first LC circuit that forms an oscillating magnetic field that causes an object to exhibit magnetic resonance. The first LC circuit includes a parallel connection assembly including a diode. The parallel connection assembly further includes a diode connected, in parallel and in reverse direction, to the diode, or an inductor connected in parallel to the diode. In a first state in which oscillating voltage for forming the oscillating magnetic field is applied to the first LC circuit, the diode of the parallel connection assembly functions as a short-circuit such that the resonance frequency of the first LC circuit becomes a first resonance frequency. In a second state in which the oscillating voltage is not applied to the first LC circuit, the diode of the parallel connection assembly functions as capacitance such that the resonance frequency of the first LC circuit becomes a second resonance frequency that is different from the first resonance frequency.

According to this configuration, in the first state, an oscillating magnetic field is formed at the first resonance frequency, and by switching from the first state to the second state, the resonance frequency of the first LC circuit (transmission circuit that emits excitation signals) transitions to the second resonance frequency. The response signals can then be received and measured at an LC circuit (reception circuit that receives response signals) of which the resonance frequency is equivalent to the first resonance frequency. Accordingly, response signals can be measured with high precision by a simple configuration in which a parallel connection assembly including a diode is used, by measuring the response signals in the second state. Specifically, the ringing component (transmission energy) transitions to the second resonance frequency side by switching from the first state to the second state, and accordingly the ringing component can be suppressed from affecting measurement results of the response signals measured at the first resonance frequency, and highly precise measurement results can be obtained.

Now, the diode of the parallel connection assembly preferably is a diode, a reverse recovery time (reverse recovery time; trr) of which or a carrier lifetime of which is shorter than a predetermined time. The predetermined time preferably is 100 microseconds or less, and more preferably is 10 microseconds or less. For example, the diode of the parallel connection assembly may be a fast recovery diode. The diode of the parallel connection assembly may a Schottky barrier diode. The parallel connection assembly may include two different types of diodes which are connected, in parallel and in reverse direction, to each other. For example, one of the two diodes may be a Schottky barrier diode and the other may be a PIN diode.

Also, the parallel connection assembly may be provided in a loop-shaped circuit portion including an inductor and a capacitor of the first LC circuit, or may be provided outside of the loop-shaped circuit portion. For example, the first LC circuit may include an inductor, a capacitor connected in parallel to the inductor, and the parallel connection assembly connected serially to the inductor or the capacitor. The first LC circuit may further include a capacitor serially connected to the inductor.

The magnetic resonance measurement apparatus may or may not further include a second LC circuit that receives responses of the object relative to the oscillating magnetic field. The magnetic resonance measurement apparatus may further include one or more LC circuits electrically/magnetically coupled with the first LC circuit, with both formation of the oscillating magnetic field and reception of responses of the object as to the oscillating magnetic field being performed by a plurality of circuits including the first LC circuit and the one or more LC circuits. In this case, a connection point of a transmission system that applies oscillating voltage to form the oscillating magnetic field, and a connection point of a reception system that analyzes electrical signals corresponding to the responses may or may not be provided at a same position in one of the plurality of circuits. Out of the plurality of circuits, a circuit at which a connection point of a transmission system that applies oscillating voltage to the plurality of circuits to form the oscillating magnetic field, is provided, may be different from a circuit at which a connection point of a reception system that analyzes electrical signals corresponding to the responses is provided, or may be the same. In the first state, the connection point of the reception system may enter into a shorted state due to the parallel connection assembly.

Advantageous Effects of Invention

Accordingly to the present invention, response signals can be measured with high precis ion by a simple configuration.

BRIEF DESCRIPTION OF DRAWINGS

FIG. 1 is a diagram illustrating an example of an LC resonance circuit (transmission circuit) according to the present embodiment.

FIGS. 2(A) and 2(B) are diagrams illustrating an example of a correlative relation between reflection loss and input power according to the present embodiment.

FIG. 3A is a diagram illustrating an example of specifications of diodes according to the present embodiment.

FIG. 3B is a diagram illustrating an example of specifications of parallel connection assemblies according to the present embodiment.

FIG. 4 is a diagram illustrating an example of a correlative relation between reflection loss and frequency, according to the present embodiment.

FIG. 5 is a diagram illustrating an example of temporal change of ringing signals according to the present embodiment.

FIG. 6 is a diagram illustrating an example of a magnetic resonance measurement apparatus according to the present embodiment.

FIG. 7 is a diagram illustrating an example of change in resonance frequency according to the present embodiment.

FIG. 8 is a diagram illustrating an example of change in resonance frequency according to the present embodiment.

FIG. 9 is a diagram illustrating an example of temporal change of measurement voltage (strength of ringing signals) according to a comparative example.

FIG. 10 is a diagram illustrating an example of temporal change of measurement voltage according to the comparative example.

FIG. 11 is a diagram illustrating an example of temporal change of measurement voltage according to the comparative example.

FIG. 12 is a diagram illustrating an example of temporal change of measurement voltage according to the present embodiment.

FIG. 13 is adiagramillustrating an example of temporal change of measurement voltage according to the present embodiment.

FIG. 14 is adiagramillustrating an example of temporal change of measurement voltage according to the present embodiment.

FIGS. 15(A) through 15(D) are diagrams illustrating modifications of a transmission circuit.

FIGS. 16(A) through 16(C) are diagrams illustrating modifications of a parallel connection assembly.

FIGS. 17(A) through 17(H) are diagrams illustrating modifications of a parallel connection assembly.

FIG. 18 is a diagram illustrating a modification of the magnetic resonance measurement apparatus.

FIG. 19 is a diagram illustrating a modification of change in resonance frequency.

FIG. 20 is a diagram illustrating a modification of the magnetic resonance measurement apparatus.

FIG. 21 is a diagram illustrating a modification of the magnetic resonance measurement apparatus.

FIG. 22 is a diagram illustrating a modification of the magnetic resonance measurement apparatus.

FIG. 23 is a diagram illustrating a modification of the magnetic resonance measurement apparatus.

DESCRIPTION OF EMBODIMENTS

<Overview>

An embodiment of the present invention will be described below with reference to the Figures. A simple method of using a parallel connection assembly including diodes is employed in the present embodiment. Note that the present invention is applicable to various magnetic resonance measurement apparatuses, such as NMR (Nuclear Magnetic Resonance) apparatuses and MRI (Magnetic Resonance Imaging) apparatuses, NQR (Nuclear Quadrupole Resonance) apparatuses, EPR (Electron Paramagnetic Resonance) apparatuses, and so forth. Note that EPR may also be referred to as ESR (Electron Spin Resonance).

Diodes have a characteristic in that current flows therethrough when voltage applied in the forward direction exceeds forward voltage Vf, but current does not flow therethrough even if voltage is applied in the reverse direction. PIN diodes are widely used in circuits that handle high-frequency (e.g., 1 MHz or higher, more preferably 10 MHz or higher) and high-power (e.g., 0.1 W or higher, more preferably 1 W or higher). The switching speed of PIN diodes is slow, and accordingly cannot immediately follow switching between positive and negative voltage that occurs at high frequencies. Accordingly, loss is generated. When the switching speed is slow, even if the voltage changes from the forward direction to the reverse direction, the current flowing through the PIN diode does not immediately become zero. Accordingly, a technique is used in which DC current is made to flow through the PIN diode, thereby (artificially) changing the characteristics of the PIN diode. Specifically, applying bias voltage (DC voltage) in the forward direction to the PIN diode causes bias current (DC current) to flow through the PIN diode. The switching speed of the PIN diode is slow, and accordingly the PIN diode maintains a conducting state in a case where the direction of high-frequency voltage (AC voltage that switches between forward direction and reverse direction at high frequency) changes to the reverse direction (even though the voltage in the reverse direction is much greater than the forward-direction bias voltage). This can be used to create a state in which high-frequency current (current from high-frequency voltage) is conducted in a case where bias voltage is being applied to the PIN diode, and in which high-frequency current is not conducted in a case where bias voltage is not being applied. However, when the high-frequency voltage is great, high-frequency current is conducted, and accordingly a large reverse bias voltage is applied to prevent conduction. PIN diodes can be used as high-frequency switches by employing these methods. For example, in a case of performing switching for high frequency and high power, the method of causing bias current to flow at the PIN diode can be employed (active switching). In any case, a low-resistance (low-loss) state can be created regarding high frequency by causing bias current to flow at the PIN diode. Also, a high-resistance state (switch off) can be created as to large high-frequency electric power by applying reverse bias voltage to the PIN diode. Note however, that switching noise is generated when turning the bias current or the reverse bias voltage from ON to OFF, or from OFF to ON, in a case of applying bias current or reverse bias voltage to the PIN diode. Switching noise impedes measurement of NMR signals, leading to the necessity to set the dead time longer, and accordingly the method of using PIN diodes as high-frequency switches is undesirable. This is undesirable in particular in cases where the Q factor of the coil is high, since induced noise signals do not readily decay.

Conversely, Schottky barrier diodes, fast recovery diodes, and switching diodes have characteristics in which the switching speed is fast. Accordingly, Schottky barrier diodes, fast recovery diodes, and switching diodes for small currents (e.g., 1 A or 100 mA) are used in high-frequency circuits. However, Schottky barrier diodes, fast recovery diodes, and switching diodes for small currents cannot withstand high power. Note that it is thought that Schottky barrier diodes, fast recovery diodes, and switching diodes for large currents (for rectifying) have poor high-frequency characteristics, and are unusable at high frequencies.

Accordingly, diodes that are commercially available for high frequencies are only small-current or large-current PIN diodes, or Schottky barrier diodes, fast recovery diodes, and switching diodes, for small currents.

In LC circuits (resonance circuits; LC resonance circuits), voltage and current in the circuits are amplified by resonance. Voltage of 100 V or more or 1000 V or more, and current of 1 A or more or 10 A or more, are generated by resonance in an LC resonance circuit, for example, although this depends on the circuit configuration. Accordingly, elements that are usable in LC circuits are limited. In particular, capacitors, diodes, and the like are limited to those that have high voltage-withstanding and current-withstanding features.

In magnetic resonance measuring apparatuses such as MRI apparatuses and NMR apparatuses, the frequency used rises in proportion to the rise in the strength of the magnetic field of the apparatus. Increase in the strength of the magnetic field improves the performance of the apparatus, and accordingly the frequency used in magnetic resonance measuring apparatuses is in an upward trend year after year. Accordingly, elements that are usable with even higher frequencies currently need to be used. Also, the time that NMR signals are present is short in solid-state NMR apparatuses, and accordingly excitation of the NMR signals needs to be performed in a short time. Excitation in a shorter time requires high-frequency electric power that is even higher in power.

From these aspects, elements usable in LC resonance circuits used for NMR and MRI, and particularly for excitation of NMR signals for solid-state NMR, have been limited to coils (inductors) and condensers (capacitors).

Accordingly, the Inventor of the present invention has conceived a simple configuration in which two large-current (100 mA or higher, 200 mA or higher, 1 A or higher, etc.) Schottky barrier diodes, which conventionally were not used, are assembled into an LC resonance circuit, anticipating two operations, which are described later. One of the two Schottky barrier diodes is connected in parallel to the other one in the opposite direction. This LC resonance circuit at least functions as part or all of a transmission circuit that forms an oscillating magnetic field (high-frequency magnetic field) that causes the object to exhibit magnetic resonance.

The first anticipated operation is operation in the transmission mode of transmitting excitation signals (oscillating magnetic field or electromagnetic waves generated by an oscillating magnetic field) that cause the object to exhibit magnetic resonance, i.e., in a state in which driving voltage (oscillating voltage; high-frequency AC voltage; voltage of 10 V or higher, 100 V or higher, 1000 V or higher, etc.) to generate excitation signals (form an oscillating magnetic field) is applied to the transmission circuit. The Inventor anticipated the following operation as an operation when in the transmission mode. The voltage applied to the parallel connection assembly (portion including the two diodes) exceeds the forward voltage of one of the two diodes, and accordingly current flows through this one diode. That is to say, the diodes of the parallel connection assembly function in the circuit as a short-circuit (short). Specifically, in a case where the amplitude of the applied voltage (AC voltage) is great, the applied voltage quickly exceeds the forward voltage. At this time, if the response speed of the diode is fast, the time over which the applied voltage is exceeding the forward voltage is long, and accordingly the diodes of the parallel connection assembly almost appear to be conducting.

The second anticipated operation is an operation in the reception mode of receiving response signals generated from the object by magnetic resonance (response of object as to excitation signals; oscillating magnetic field or electromagnetic waves generated by an oscillating magnetic field), i.e., in a state when the oscillating voltage is not applied to the transmission circuit. The Inventor anticipated the following operation as an operation when in the reception mode. The voltage applied to the diodes of the parallel connection assembly (diodes having suitable characteristics; each of the two diodes) does not exceed the forward voltage, and accordingly current does not flow through the diodes, and the diodes function as capacitance on the circuit.

There also are cases where the parallel connection assembly only has one diode, and cases where the parallel connection assembly has three or more diodes, which will be described in detail later. The above two operations can be anticipated in these cases as well.

The resonance frequency of the transmission circuit is dependent on the capacitance of the transmission circuit. According to the two operations above, switching from the transmission mode to the reception mode generates new capacitance in the transmission circuit, thereby changing the total capacitance, and the resonance frequency changes. This will be described in further detail. In one cycle of driving voltage (AC voltage) in the transmission circuit, there are an instant of accumulating transmission energy in a magnetic field (current; inductance) as an instant of accumulating transmission energy (energy of excitation signal), and an instant of accumulating transmission energy in an electric field (voltage; capacitance). Voltage applied to the parallel connection assembly gradually is generated from the instant (applied voltage is zero) in which transmission energy is accumulated in a magnetic field (current). Switching from the transmission mode to the reception mode then causes the amplitude of the applied voltage (AC voltage) that is generated to gradually (in each cycle) decrease, and to gradually (in each cycle) draw near to a state in which the diodes of the parallel connection assembly can be deemed to be capacitance. As a result, the total capacitance gradually (in each cycle) changes, and the resonance frequency gradually (in each cycle) changes.

Due to the above change in resonance frequency, the frequency of the transmission energy accumulated in the transmission circuit at when in the transmission mode can be transitioned to a different frequency when switching from the transmission mode to the reception mode (prior to or after going to the reception mode). As a result, the frequency of the transmission energy accumulated when in the reception mode is a different frequency from that of the NMR signals (response signals) received. Accordingly, the effects of ringing signals (accumulated transmission energy) can be reduced, and the reception energy (energy of response signals) can be measured with high precision. Note that by providing the transmission circuit with a filter that does not pass the accumulated transmission energy (the transmission energy having the post-change frequency) enables the effects of ringing to be further reduce, and reception energy to be measure with high precision. Also, in cases where ringing related to mechanical vibrations of the circuit (acoustic ringing) generated by piezoelectric effects or the like occurs, the same operations and advantages can be obtained. That is to say, the frequency of the energy generating acoustic ringing can be transitioned to a different frequency when switching from the transmission mode to the reception mode (prior to or after going to the reception mode), and accordingly the effects of acoustic ringing can be reduced, and the reception energy can be measured with high precision.

Note that there are conventional methods to reduce the effects of ringing, such as a method of installing a special circuit outside of the resonance circuit, a method of using external control signals and bias current (active switching), and so forth. However, these methods need special circuits (not simple configurations), and accordingly costs increase. Conversely, the effects of ringing can be reduced with a simple configuration of assembling a parallel connection assembly including diodes in the present embodiment, and accordingly there is hardly any increase in costs at all.

There also is a method to assemble diodes or the like in a reception circuit (reception coil) that receives response signals, and operate the diodes with energy from the transmission circuit (transmission coil), thereby changing the resonance frequency of the reception circuit. This is a method that temporarily makes the passage characteristics (S21 and S12; coupling) of the transmission circuit and the reception circuit poorer, and improves isolation. This method is a method of innovation of the reception circuit to protect the reception circuit by reducing the energy reaching the reception circuit from the transmission circuit, and clearly differs from the method of the present embodiment that deals with innovation of the transmission circuit. Also, while conventional methods need the transmission circuit and the reception circuit to be separately prepared, the method according to the present embodiment is applicable to circuit configurations in which the transmission circuit also serves as the reception circuit.

<Confirmation of Operations as Anticipated>

In order to confirm that the above-described operations are realized as anticipated, the Inventor fabricated an LC resonance circuit 100 (a circuit that can be deemed to be the LC resonance circuit 100) illustrated in FIG. 1, and performed various types of measurements. The LC resonance circuit 100 has an inductor 101, a capacitor 102, a parallel connection assembly 103 and a matching capacitor 104. The parallel connection assembly 103 is serially connected to the inductor 101, and the capacitor 102 is connected in parallel to the inductor 101 and the parallel connection assembly 103. The matching capacitor 104 is connected serially to a circuit portion (loop-shaped circuit portion) made up of the inductor 101, the capacitor 102, and the parallel connection assembly 103. The LC resonance circuit 100 is grounded between the inductor 101 and the capacitor 102. The parallel connection assembly 103 includes a diode (Schottky barrier diode) 103-1 and a diode (Schottky barrier diode) 103-2 that is connected in parallel to the diode 103-1 in the reverse direction. An inductor having inductance of approximately 450 nH was used as the inductor 101, and a capacitor having capacitance of 56 pF was used as the capacitor 102.

'Measurement of Reflection Loss»

First, in order to use more preferable diodes as the diodes 103-1 and 103-2, measurement of reflection loss was performed. A commonly-used network analyzer cannot output high power, and accordingly cannot measure high-power characteristics. Accordingly, an NMR apparatus manufactured by Bruker Corporation was used, a directional coupler was inserted between the LC resonance circuit 100 and a power amp, and an oscilloscope was connected thereto, thereby measuring input power (input energy; driving electric power) to the LC resonance circuit 100 and reflection power from the LC resonance circuit 100. Reflection loss is obtained by dividing reflection power by input power. In the case of high frequency, the power ratio that is reflection loss is generally written in increments of dB. If the frequency of the input power agrees with the resonance frequency of the LC resonance circuit 100, and also if matching is suitable, the input power will be accumulated in the LC resonance circuit 100 (will resonate in the LC resonance circuit 100) and not be reflected, thereby yielding a value smaller than zero for the reflection loss. Conversely, if the frequency of the input power is different from the resonance frequency of the LC resonance circuit 100, or if matching is unsuitable, the input power will be reflected from the LC resonance circuit 100 and return, thereby yielding a value close to zero for the reflection loss. Thus, whether the input power is resonating in the LC resonance circuit 100 or not, how much of the input power was reflected without resonating at the LC resonance circuit 100, and so forth, can be found from the reflection loss.

The resonance frequency was adjusted in a state without the parallel connection assembly 103 and reflection loss at high power was measured, and thereafter the parallel connection assembly 103 was inserted and reflection loss at high power was measured. Specifically, various types of adjustments (settings) regarding the LC resonance circuit 100 were performed, so that the resonance frequency was 20 MHz to 40 MHz. The pulse duration of input power (input pulses) was 10 microseconds. The measurement results in FIG. 2(A) were obtained as measurement results of reflection loss. FIG. 2(A) shows a graph having a reflection loss axis and an input power axis. Six types of diodes A through F were alternatingly used for the diodes of the parallel connection assembly 103 (each of the diodes 103-1 and 103-2) as cases of the parallel connection assembly 103 being inserted, and the measurement results for six patterns respectively corresponding to the six types of diodes A through F were obtained as measurement results thereof, as illustrated in FIG. 2(A). The detailed specifications of the diodes A through F are as shown in FIG. 3A.

The reflection loss in the state without the parallel connection assembly 103 increased as the input power increased, but was generally −10 dB or lower, as illustrated in FIG. 2(A). In a case where the parallel connection assembly 103 was inserted, the reflection loss was great in the range of input power of 0.1 W or lower, and resonance was not occurring (was not in a resonating state). When the input power exceeded 0.1 W, the reflection loss became smaller, and in a case of input power of 10 W or higher, reflection loss equivalent to the state without the parallel connection assembly 103 was obtained. Further, the characteristics of the diodes A through F maintained reversibility even at input power of 100 W or higher, such as 300 W for example, and pulse duration of 100 milliseconds, and the diodes A through F did not undergo breakdown. The measurement results of the case of inserting the parallel connection assembly 103 will be described in detail below, with reference to FIG. 2(A).

As described above, it was found that increasing the input power reduces the reflection loss, and a resonance state is obtained. Taking note of the input power at 0.1 W or lower in FIG. 2(A), the input power was almost totally reflected for the diodes E and F. Meanwhile, it was found that the reflection loss for the diodes A, B, C, and D was smaller than 0 dB, and that part of the input power was absorbed by the LC resonance circuit 100 (slight resonance was occurring). Such resonance (slight resonance) occurs due to the frequency band of the input power being near the resonance frequency band, and part of the frequency band of the input power being included in a dip in reflection loss indicating the resonance frequency band. This corresponds to the shift amount in resonance frequency band due to the parallel connection assembly 103 being small, or the Q factor indicating the performance of the LC resonance circuit 100 being small due to loss of the parallel connection assembly and the frequency band of the dip in reflection loss being broad.

Thus, the diodes A, B, C, and D constantly generate faint resonance even if the input power is varied. Also, the diode F exhibits almost total reflection of input energy of than 1 W or lower, but yields reflection loss somewhat greater than a state without the parallel connection assembly 103 (i.e., the resonance is somewhat weak) in a case where the input power is 10 W or higher. In the case of the characteristics of such diodes A, B, C, D, and F, it is expected that the effects of ringing can be reduced, but that the effectiveness thereof will be somewhat smaller. Conversely, the diode E exhibits almost total reflection of the input energy no greater than 0.1 W, and yields reflection loss equivalent to the state without the parallel connection assembly 103 in a case of input power of 10 W or higher. Such characteristics are extremely good characteristics for realizing operations as anticipated (extremely close to those anticipated). Accordingly, the Inventor used the diode E for each of the diodes 103-1 and 103-2, and performed further measurement. The results of the further measurement using the diode E will be described later with reference to FIGS. 4 through 14.

The Inventor of the present application measured reflection loss using parallel connection assemblies of the following configurations, anticipating that characteristics good for realizing the above operations (operations in which the diodes of the parallel connection assembly are shorted when in transmission mode, and function as capacitance when in reception mode) would be obtained, even if the parallel connection assembly has the following configurations. FIG. 2(B) illustrates the measurement results thereof.

The diodes are not Schottky barrier diodes.
The two diodes differ in type from each other.
The element connected in parallel to the diode is not a diode but an inductor.

The detailed specifications of the parallel connection assemblies G through N shown in FIG. 2(B) are as shown in FIG. 3B. In FIG. 3B, information other than "Arrangement" is diode information for parallel connection assemblies G through J and L through N, and is information of the parallel connection assembly for the parallel connection assembly K.

In the test (measurement) in FIG. 2(B), the test frequency is 24.84 MHz. Other conditions are the same as the test in FIG. 2(A). In testing of the parallel connection assemblies G, H, I, and J, the capacitance that the diodes themselves have was small, and accordingly, a 47 pF condenser was attached in parallel to the reversely-arrayed parallel diode. This enables the amount of change in frequency during reception to be stabilized, but attaching of a condenser is not indispensable.

In the parallel connection assemblies G, H, and I, two fast recovery diodes that have short reverse recovery time are connected in parallel in reverse to each other. The fast recovery diodes are, out of PN diodes, diodes that have a reverse recovery time of 100 microseconds or less, more preferably 10 microseconds or less. As the input power was gradually increased, the reflection loss rapidly decreased. That is to say, by gradually increasing the input power, the diodes operated and were in a shorted state, and the resonance frequency of the LC resonance circuit 100 became the same as the transmission frequency (resonance frequency that causes the object to exhibit magnetic resonance at the object). The shorter the reverse recovery time was, the lower the input power for the resonance frequency of the LC resonance circuit 100 to become the same as the transmission frequency was. Specifically, the resonance frequency of the LC resonance circuit 100 became the same as the transmission frequency at a lower input power for the parallel connection assembly G as compared to the parallel connection assembly H, and at a lower input power for the parallel connection assembly H as compared to the parallel connection assembly I. From this, it can be said that the shorter the reverse recovery time is, the better. Further, the shorter the reverse recovery time is, the smaller the loss (heat generation) at the diode is, and accordingly, taking into consideration cases of using at high power, the shorter the reverse recovery time is, the better.

In the parallel connection assembly J, two PIN diodes are connected in parallel, reverse to each other. In the case of PIN diodes, performance of responsivity are represented by carrier lifetime ($\tau$). With the forward-direction bias current in the PIN diodes as IF and the reverse-direction bias current as IR, the time T for the direction of current flowing at the PIN diodes from the forward direction to be switched to the reverse direction (equivalent to reverse recovery time) can be calculated by an expression of "$T=\tau \log_e(1+IF/IR)$". The ratio of forward-direction bias current IF and reverse-direction bias current IR changes under various conditions, and cannot be fixedly determined, but the time T can be predicted to be a value in the order of ten times the carrier lifetime $\tau$ to $1/100$ thereof. The parallel connection assembly J exhibited good characteristics, thanks to the test frequency being 24.84 MHz, which is low.

Good results were obtained even when the diodes were not Schottky barrier diodes, as with the parallel connection assemblies G, H, I, and J.

The parallel connection assembly K has a PIN diode, and a Schottky barrier diode connected to this PIN diode in parallel in the reverse direction. Good characteristics were obtained even with the parallel connection assembly K. That is to say, good characteristics were obtained even when the types of the two diodes connected in parallel were different from each other.

In the parallel connection assembly L, a coil (inductor) of 120 nH is connected to a Schottky barrier diode in parallel, in the parallel connection assembly M, a coil of 120 nH is connected to a fast recovery diode in parallel, and in the parallel connection assembly N, a coil of 120 nH is connected to a PIN diode in parallel. Good characteristics were obtained from the parallel connection assemblies L, M, and N as well. Specifically, the parallel connection assembly N yielded better characteristics than the parallel connection assembly M, and the parallel connection assembly M yielded better characteristics than the parallel connection assembly L. In the parallel connection assembly L in which a Schottky barrier diode and an inductor were combined, the reflection loss did not become smaller even if input power was increased, as compared to the other results, but better characteristics are obtained at higher frequencies. Even if an element connected in parallel to a diode is an inductor and not a diode, such as in the parallel connection assemblies L, M, and N, good characteristics were obtained.

In this way, good characteristics for realizing the above operations (operations in which the diodes of the parallel connection assembly are shorted when in transmission mode, and function as capacitance when in reception mode) are obtained by parallel connection assemblies of various configurations. Also, the reverse recovery time or carrier lifetime is preferably short, since the transmission/reception switching time (dead time) is long when the reverse recovery time or carrier lifetime of the diode in the parallel connection assembly is long. Specifically, the reverse recovery time is preferably 100 microseconds, and more preferably 10 microseconds or less. The carrier lifetime is preferably a time equivalent to the reverse recovery time of 100 microseconds, and more preferably a time equivalent to the reverse recovery time of 10 microseconds. The intrinsic semiconductor layer (I layer) of PIN diodes has thickness, and accordingly a carrier lifetime that is longer than zero exists. In Schottky barrier diodes, metal and semiconductor are joined, and accordingly there is no intrinsic semiconductor layer (I layer). Accordingly, theoretically, reverse recovery time or carrier lifetime is nonexistent or zero in Schottky barrier diodes. Thus, the findings that "The carrier lifetime preferably is a time equivalent to the reverse recovery time of 100 microseconds, and more preferably a time equivalent to the reverse recovery time of 10 microseconds." do not contradict that good characteristics are obtained by Schottky barrier diodes (FIG. 2(A)). Note that in the case of active switching, providing just one of the diodes will yield sufficient functioning.

«Measurement of Frequency Characteristics»

Frequency characteristics (a plurality of frequency characteristics respectively corresponding to a plurality of input powers) of the LC resonance circuit 100 were measured, using the diode E as each of the diodes 103-1 and 103-2. A commonly-used network analyzer cannot output high power, and accordingly cannot measure high-power characteristics. Thus, a spectrum analyzer provided with a tracking generator was used, the output of the tracking generator was amplified as appropriate by an amp and an attenuator, and this was input to the LC resonance circuit 100 through a directional coupler. The frequency characteristics (reflection characteristics; correlative relation between reflection loss and frequency) obtained from the directional coupler were converted into suitable power via the attenuator as appropriate, and measured by the spectrum analyzer. If matching is suitable, the reflection loss will be small at the resonance frequency, and the reflection loss will be great at other frequencies, and accordingly a curve that has a dip at the resonance frequency is obtained as frequency characteristics curve. The narrower the frequency band of this dip is, the higher the Q factor is, and large resonance with small loss can be obtained. That is to say, in a case where the frequency band of this dip is narrow, the LC resonance circuit 100 can be said to be a circuit with high performance and high frequency selectivity.

FIG. 4 illustrates measurement results of frequency characteristics. FIG. 4 shows a graph having a reflection loss axis and a frequency axis. As shown in FIG. 4, a dip with a narrow frequency band (high Q factor) appeared at 39.6 MHz regarding input power of −10 dBm (0.1 mW) or lower, and resonance with high frequency selectivity was obtained. From there, as input power was increased, the resonance frequency moved to the low-frequency side while matching gradually deteriorated. Then, a dip with a narrow frequency band (high Q factor) appeared at 31.3 MHz regarding input power of 28 dBm (approximately 1 W), and resonance with high frequency selectivity was obtained. Thus, the resonance frequency smoothly changed in accordance with the input power, and resonance with dips with narrow frequency bands (high Q factors) and high selectivity of frequency was obtained before starting change and after ending. If the frequency selectivity of resonance is high and the amount of change in the resonance frequency is great, the dip in resonance frequency before starting change and the dip in resonance frequency after end of the change hardly overlap each other at all. Accordingly, there is hardly any effect of one of the two resonance frequencies (resonance frequency before starting change and resonance frequency after change ends) on the other. As a result, the effects of ringing can be reduced. These measurement results are measurement results in line with the above-described anticipations, and it was confirmed that the LC resonance circuit 100 realizes the operations as anticipated.

As described above, the dip in resonance frequency when generating excitation signals (during high-power input) and the dip in resonance frequency when receiving the faint NMR signals preferably do not overlap each other. In order to realize this, preferably, matching at the resonance circuit is appropriate both when generating excitation signals and when receiving NMR signals, and the difference between the resonance frequencies when generating excitation signals and when receiving NMR signals is appropriately large. Specifically, when receiving NMR signals, the reflection coefficient of the resonance circuit at the resonance frequency preferably is −5 dB or lower, and more preferably is −10 dB or lower. Also, the above difference among resonance frequencies is preferably greater than resonance frequency/Q/2 when receiving NMR signals. "Q" here is the Q factor of the resonance circuit when receiving NMR signals.

«Measurement of Temporal Change of Ringing Signals»

The LC resonance circuit 100 having the diode E as each of the diodes 103-1 and 103-2 was connected to an NMR apparatus from Bruker Corporation, and temporal change of ringing signals (accumulated transmission energy) was measured. The resonance frequency of the input transmission signals (excitation pulses) was 31.6 MHz, the input power was 10 W, and the pulse duration of the input power (input pulses) was 10 microseconds. A state (timing) at which the supply of input power was stopped was used as the initial state for measurement. In order to observe the state of resonance, a pickup coil for magnetic field measurement was disposed near the inductor (coil) 101 and connected to an oscilloscope. The pickup coil is not a resonance circuit, and accordingly the strength and the frequency of the magnetic field being generated at the LC resonance circuit 100 can be observed on the oscilloscope. Measurement values (high-frequency signals) obtained at each of certain time intervals from the instant of stopping supply of input power were subjected to Fourier transform, and temporal change of the measurement values were examined. Since the change in strength of ringing signals is extremely great, the same measurement was repeated while changing the measurement range (voltage range) of the oscilloscope, and measurement values of an appropriate measurement range were extracted. As a result, the noise level in the measurement values differs for each timing.

FIG. 5 shows measurement results of temporal change of ringing signals. FIG. 5 shows a graph that has a signal strength axis and a frequency axis. The ringing signals rapidly decayed from the start of the measurement (the instant that supply of input power was stopped), as shown in FIG. 5. The frequency (peak) of the ringing signals was 31.6 MHz at the time of starting measurement, but was approximately 35 MHz at 1.2 microseconds after starting measurement. The frequency of ringing signals was approximately 40 MHz at 1.4 microseconds after starting measurement, and there were no more ringing signals at the original frequency (31.6 MHz). It can be understood from this that the energy of the ringing signals transitioned to another frequency. Accordingly, NMR signals (response signals) that are present at the original frequency can be measured with high precision without being obstructed by ringing signals, before the ringing signals completely decay. These measurement results also are measurement results in line with the above-described anticipations, and confirmation was made that the operations as anticipated were being realized in the LC resonance circuit 100.

Note that faint signals were not able to be measured in the above measurement, since an oscilloscope was used. In actual NMR measurement, signals that are far fainter are measured, so prolonged ringing is a great problem. However, according to the above measurement results, the frequency of the ringing signals changes and ringing signals of the original frequency decay in a short time and further disappear, and accordingly response signals can be measured with high precision.

Example of Magnetic Resonance Measurement Apparatus (Ringing Measurement)

The Inventor fabricated a magnetic resonance measurement apparatus 300 illustrated in FIG. 6, and performed various types of measurement, in order to confirm that response signals can be measured with high precision. The magnetic resonance measurement apparatus 300 has the LC resonance circuit 100 as a transmission circuit, and has an LC resonance circuit 200 separate from the LC resonance circuit 100 as a reception circuit. The transmission circuit 100 is connected to an NMR apparatus from Bruker Corporation, and an oscilloscope is connected to the reception circuit 200.

The inductor (transmission coil) 101 of the transmission circuit 100 and an inductor (reception coil) 201 of the reception circuit 200 were disposed so as to be orthogonal to each other in the proximity of a measurement sample (object). Thus, a high level of isolation between the transmission circuit 100 and the reception circuit 200 is obtained. That is to say, the state is such that there is almost/ completely no electric/magnetic coupling between the transmission circuit 100 and the reception circuit 200. Accordingly, the magnetic resonance measurement apparatus 300 can be said to be a "non-coupling magnetic resonance measurement apparatus".

Note that while the transmission coil for excitation of NMR signals and the reception coil for receiving NMR signals preferably are orthogonal to each other, this is not imperative. A magnetic resonance measurement apparatus in which the transmission coil and the reception coil are separated, and a layout is employed such that electromagnetic interference does not occur therebetween, is a non-coupling magnetic resonance measurement apparatus. Isolation between the transmission circuit and the reception circuit in a non-coupling magnetic resonance measurement apparatus preferably is 5 dB or higher, and more preferably 10 dB or higher.

An active switch that switches on/off under control of external signals is built into the reception circuit 200. Accordingly, in the transmission mode of emitting excitation signals, the active switch is closed and the resonance frequency of the reception circuit 200 is lowered, thereby suppressing resonance of the reception circuit 200 under the powerful excitation signals. When the active switch is opened, the resonance frequency of the reception circuit 200 rises to the frequency to be measured (reception mode). Setting the reception circuit 200 to the reception mode at an appropriate timing enables the effects of ringing to be further reduced. Note that the active switch may be provided anywhere, as long as the resonance frequency of the reception circuit 200 can be changed. The resonance frequency may be changed by a method other than a method using an active switch.

An arrangement was made in which blanking signals for the power amp of the NMR apparatus are used for switching between the transmission mode and the reception mode, so that the timing of switching between the transmission mode and the reception mode can be freely changed at a signal generator. The resonance frequency of the transmission circuit 100 in the transmission mode and the resonance frequency (reception frequency) of the reception circuit 200 in the reception mode were set to 25 MHz. The resonance frequency (transmission frequency) of the transmission circuit 100 in the transmission mode is a resonance frequency at which the object exhibits magnetic resonance. Also, the input power was set to 10 W, and the pulse duration of the input power (input pulses) to 10 microseconds.

In the present embodiment, the resonance frequency of the transmission circuit 100 increases from the excitation frequency (frequency necessary for excitation of NMR signals; transmission frequency) in accordance with switching from the transmission mode to the reception mode (stopping supply of input power), as described with reference to FIG. 5 and so forth. The resonance frequency of the reception circuit 200 then increases to the observation frequency (frequency for observing NMR signals; reception frequency) in accordance with switching from the transmission mode to the reception mode (opening of the active switch), as described above. That is to say, the resonance frequency of the transmission circuit 100 and the resonance frequency of the reception circuit 200 both increase in accordance with switching from the transmission mode to the reception mode, as illustrated in FIG. 7.

Note that the direction of transition and the amount of transition of the resonance frequency is not limited in particular. For example, an arrangement may be made where the resonance frequency of the transmission circuit 100 and the resonance frequency of the reception circuit 200 both decrease in accordance with switching from the transmission mode to the reception mode. The resonance frequency of the transmission circuit 100 and the resonance frequency of the reception circuit 200 may transition, crossing each other in accordance with switching from the transmission mode to the reception mode, as illustrated in FIG. 8. Note however, the resonance frequency of the transmission circuit 100 and the resonance frequency of the reception circuit 200 preferably transition in the same direction so as not to cross each other, since there is concern of ringing signals obstructing observation of NMR signals at the timing of crossing. The amount of transition of the resonance frequency of the transmission circuit 100 may be larger than or smaller than the amount of transition of the resonance frequency of the reception circuit 200, or may be equal.

«Results of Comparative Example»

For comparison, measurement was performed using a transmission circuit in which the parallel connection assembly 103 was not assembled therein, instead of the transmission circuit 100, and measurement results illustrated in FIGS. 9 through 11 were obtained. FIGS. 9 through 11 show graphs that have a measurement voltage (measurement value; strength of ringing signals) axis and a time axis. Note that other conditions, such as measurement conditions were in common (the same) for measurement using the transmission circuit 100 and measurement using the transmission circuit without the parallel connection assembly 103.

As shown in FIG. 9, leakage signals of the powerful excitation signals (excitation waves) were detected, despite the reception circuit being in the transmission mode and the resonance frequency of the reception circuit being different from the resonance frequency of the transmission circuit. After ending output of excitation signals (supply of input power to the transmission circuit; 10 microseconds), residual excitation signals (ringing signals) must quickly disappear and an environment be made in which the faint NMR signals can be measured. Switching from the transmission mode to the reception mode at an appropriate timing enables the dead time (ringing time) to be shortened. Accordingly, assuming that the voltage range of NMR signals was ±500 µV, the shortest time for timing at which the strength (amplitude) of the ringing signals becomes ±500 µV or lower (timing of switching from transmission mode to reception mode) was examined. As a result, by switching from the transmission mode to the reception mode at 6.4 microseconds after transmission (output) of the excitation signals ends, the strength of the ringing signals became ±500 µV or lower at 7.07 microseconds after ending transmission of the excitation signals, as illustrated in FIG. 10, enabling measurement of NMR signals. That is to say, in the Comparative Example, the shortest dead time is approximately microseconds, and there is a need to wait at least approximately 7 microseconds in order to measure NMR signals. However, the NMR signals become extremely weak due to decay after waiting for approximately 7 microseconds, and accordingly the NMR signals cannot be measured with high precision.

Also, in the Comparative Example, no diodes are assembled in, and accordingly the resonance frequency of the transmission circuit and the resonance frequency of the reception circuit are equivalent in the reception mode. Accordingly, if the timing of switching from the transmission mode to the reception mode is too early, the reception circuit receives energy remaining in the transmission circuit in the reception mode, and measurement of NMR signals becomes nearly impossible. For example, switching from the transmission mode to the reception mode at 2.8 microseconds after ending output of excitation signals causes the ringing signals from the transmission circuit to be reamplified by resonance at the reception circuit as illustrated in FIG. 11, thereby prolonging ringing as a result, and measurement of NMR signals becomes nearly impossible.

«Results of Present Example»

Measurement using the transmission circuit 100 with the parallel connection assembly 103 assembled in yielded the measurement results in FIGS. 12 through 14. FIGS. 12 through 14 show graphs having a measurement voltage (measurement value) axis and a time axis.

The voltage range of NMR signals was assumed to be ±500 µV, in the same way as with the Comparative Example. By switching from the transmission mode to the reception mode at 1 microsecond after transmission of the excitation signals ends, the strength of the ringing signals became ±500 µV or lower at 1.94 microseconds after ending transmission of the excitation signals, as illustrated in FIGS. 12 and 13, enabling measurement of NMR signals. That is to say, according to the measurement results of the Present Example, the dead time is approximately 2 microseconds, and NMR signals can be measured after a waiting time of no more than ⅓ that of the Comparative Example (approximately 7 microseconds). The decay of the NMR signals is relatively small after an approximately 2-microsecond wait, and accordingly NMR signals can be measured with high precision. In the Present Example, the frequency of the ringing signals (resonance frequency of the transmission circuit 100) gradually deviates from the resonance frequency at the reception circuit 200 in the reception mode. Accordingly, the above-described reduction of dead time is realized. Note that cooling the coil to raise the performance (Q factor) makes ringing signals to decay less readily, and thus the parallel connection assembly 103 can function more effectively and the degree of shortening the dead time can be improved even further.

Also, the timing of switching from the transmission mode to the reception mode was quickened, in the same way as in the Comparative Example. Specifically, switching from the transmission mode to the reception mode was performed at the timing at which the strength (amplitude) of voltage generated at the reception circuit 200 by the switching was the same as that in the Comparative Example (FIG. 11). As a result, the ringing signals quickly decayed as illustrated in FIG. 14, unlike in the Comparative Example. Accordingly, in the Present Example, NMR signals can be detected with high precision even if the timing of switching is quickened. This also is due to the frequency of the ringing signals gradually deviating from the resonance frequency of the reception circuit 200 in the reception mode. Note that in order to receive NMR signals with little decay, the time of switching from the transmission mode to the reception mode (dead time) is preferably 100 microseconds or less, and more preferably 10 microseconds or less.

As described above, according to the present embodiment, due to the resonance frequency of the transmission circuit transitioning to a second resonance frequency following excitation signals being emitted at a first resonance frequency, the frequency of the ringing signals transitions to a frequency equivalent to the second resonance frequency. The response signals are then measured by being received at the reception circuit of which the resonance frequency is equal to the first resonance frequency. Accordingly, measurement of ringing signals having a frequency equivalent to the second resonance frequency is suppressed in measurement of the response signals, and the response signals can be measured with high precision. In this way, according to the present embodiment, response signals can be measured with high precision, by a simple configuration of using a parallel connection assembly including diodes.

<Modification>

It should be noted that the above embodiment is but an example and the present invention is not limited by the above embodiment, and that various forms (configurations obtained by appropriately modifying, altering, combining, and so forth, the above-described and later-described configurations) in a scope not departing from the essence of the present invention are included in the present invention.

For example, condensers and inductors for matching, distributed constant circuits such as quarterwave circuits, active elements such as diodes, and so forth, may further be assembled into various types of LC resonance circuits. The characteristics of the diode 103-1 and the diode 103-2 may be different from each other.

Also, the parallel connection assembly 103 may be placed anywhere as long as within the transmission circuit (LC resonance circuit) 100. The parallel connection assembly 103 preferably is provided in a loop-shaped circuit portion including an inductor and a condenser (capacitor), but may be provided outside of this loop-shaped circuit portion. The parallel connection assembly 103 may be provided to a matching circuit portion (a portion where an element for matching is provided). The parallel connection assembly 103 may be provided to a portion connected to the loop circuit portion (the above-described loop-shaped circuit portion) or matching circuit portion.

The transmission circuit 100 may also have a configuration such as illustrated in FIGS. 15(A) through 15(D). The parallel connection assembly is provided to the inductor side of the loop circuit portion (the parallel circuit portion of the inductor and the condenser) in FIG. 15(A), the parallel connection assembly is provided to the condenser side of the loop circuit portion in FIG. 15(B). The loop circuit portion includes an inductor, a matching condenser, and a resonance condenser in FIGS. 15(C) and 15(D). The resonance condenser is serially connected to the inductor, and the matching condenser is connected to the resonance condenser and the inductor in parallel. The parallel connection assembly is provided at the side of the resonance condenser and the inductor in FIG. 15(C), and the parallel connection assembly is provided to the side of the matching condenser in FIG. 15(D).

Also, the parallel connection assembly 103 may have a configuration such as illustrated in FIGS. 16(A) through 16(C). A combination of a diode, and a diode connected in parallel to the diode in the reverse direction, will be referred to here as "diode pair". In FIG. 16(A), a plurality of diode pairs is serially connected, and in FIG. 16(B), a plurality of diode pairs is connected in parallel. The plurality of diode pairs serially connected here will be referred to as "pair group". In FIG. 16(C), a plurality of pair groups is connected in parallel. The number of diode pairs and pair groups is not limited in particular. Serially connecting a plurality of diode pairs raises the operation start voltage, and accordingly the parallel connection assembly 103 can be made to function as capacitance at a quicker timing. Also, connecting a plurality of diode pairs or pair groups in parallel increases the allowable current amount, and accordingly the circuit or apparatus can be made to handle higher power. Also, portions of pair groups where the potential is the same as each other may be connected to each other. Note that each diode pair may be deemed to be a parallel connection assembly. That is to say, a plurality of parallel connection assemblies may be connected serially or in parallel.

Also, the parallel connection assembly 103 may have a configuration such as illustrated in FIGS. 17(A) through 17(H). Two diodes and one condenser are connected in parallel in FIG. 17(A), two diodes and one inductor are connected in parallel in FIG. 17(B), and two diodes and one resistor are connected in parallel in FIG. 17(C). One condenser is serially connected to two diodes connected in parallel in FIG. 17(D), one inductor is serially connected to two diodes connected in parallel in FIG. 17(E), and one resistor is serially connected to two diodes connected in parallel in FIG. 17(F). An inductor is connected in parallel to a diode in FIG. 17(G), and a serially-connected inductor and a condenser are connected to a diode in parallel in FIG. 17(H). In this way, various configurations can be employed as the configuration of the parallel connection assembly 103. The parallel connection assembly 103 may be configured by appropriately combining circuit portions in FIGS. 17(A) through 17(H) and FIGS. 16(A) through 16(C) and so forth.

Although an example of a non-coupling magnetic resonance measurement apparatus has been described, the magnetic resonance measurement apparatus may be a coupling-type apparatus. A coupling magnetic resonance measurement apparatus has a plurality of circuits that are coupled to each other electrically/magnetically, and performs both transmission of excitation signals and reception of NMR signals by the plurality of circuits. That is to say, in the coupling magnetic resonance measurement apparatus, one or more coils are used for both transmission of excitation signals and reception of NMR signals. In a case of using coils with a high Q factor, such as high-temperature superconducting coils, a non-coupling magnetic resonance measurement apparatus is preferable.

In a coupling magnetic resonance measurement apparatus, two or more resonance frequencies can be obtained by two or more LC resonance circuits electrically/magnetically coupling with each other. Note that in a case where the coupling of the circuit is weak, the difference between the resonance frequencies will be small, and in a case where the coupling of the circuit is strong, the difference between the resonance frequencies will be great. Accordingly, the difference between the resonance frequencies can be controlled by controlling the strength of coupling.

In a coupling magnetic resonance measurement apparatus that has the parallel connection assembly, the parallel connection assembly operates by powerful excitation signals and so forth, and the resonance state changes so that the plurality of resonance frequencies moves. Accordingly, one of the plurality of resonance states can be used when transmitting excitation signals, and the other one of the plurality of resonance states can be used when receiving NMR signals. Controlling the capacity of capacitors, the coupling state of circuits, and so forth, enables the resonance frequency used when transmitting excitation signals (excitation frequency) and the resonance frequency used when receiving NMR signals (observation frequency) to be made to agree.

In a coupling magnetic resonance measurement apparatus, one parallel connection assembly may be provided, or a plurality of parallel connection assemblies may be provided. Also, one or more parallel connection assemblies may be provided to each of the plurality of LC resonance circuits. Also, in the plurality of circuits, which are electrically/magnetically connected to each other, the position of a connection point of a transmission system that applies voltage to the plurality of circuits to transmit the excitation signals, and the position of a connection point of a reception system that analyzes electrical signals corresponding to NMR signal (response signals) are not limited in particular. The connection point of the transmission system and the connection point of the reception system may or may not be provided at the same position of the same circuit. That is to say, the connection point of the transmission system and the connection point of the reception system may or may not be held in common. Out of the plurality of circuits, a circuit at which a connection point of the transmission system is provided may be different from a circuit at which a connection point of the reception system is provided, or may be the same. In a case in which any parallel connection assembly is present between a connection point and a ground point of the receiving system, the parallel connection assembly can be deemed to be in a shorted state when in an operating state, which is more preferable for protecting the reception system, but the connection points of the reception system may be situated anywhere. Optional element such as capacitance, inductance, quarterwave circuits, diodes, etc., may be added to the reception system, for matching and in order to reduce transmission signal leakage, and so forth. Although an optional parallel connection assembly is preferably situated between a connection point and a ground point of the reception system, a separate element connected serially or in parallel to a parallel connection assembly may further be situated between a connection point and a ground point of the reception system. That is to say, various configurations are conceivable as a configuration of a coupling magnetic resonance measurement apparatus.

For example, a coupling magnetic resonance measurement apparatus may have the configuration illustrated in FIG. 18. The magnetic resonance measurement apparatus in FIG. 18 has two LC resonance circuits, with one connection point provided connected to both the transmission system and the reception system of one of the LC resonance circuits. The inductor of one LC resonance circuit is placed in an orientation parallel (not orthogonal) to the inductor of the other LC resonance circuit, so that the two LC resonance circuits are magnetically coupled with each other.

Calculation was performed using a high-frequency circuit simulator, so that the excitation frequency and the observation frequency of the magnetic resonance measurement apparatus in FIG. 18 agree at 40 MHz. The results thereof are shown in FIG. 19. Two resonance frequencies are obtained by the magnetic resonance measurement apparatus in FIG. 18. When transmitting excitation signals, the high-frequency side resonance frequency of the two resonance frequencies can be used as the excitation frequency, and when receiving NMR signals, the low-frequency side resonance frequency of the two resonance frequencies can be used as the observation frequency. In FIG. 19, the parallel connection assembly operates by powerful excitation signals and so forth, whereby both the excitation frequency and the observation frequency are 40 MHz. Note that the time of switching the resonance frequencies illustrated in FIG. 19 (switching from the resonance frequency for when transmitting excitation signals to the resonance frequency for when receiving NMR signals) preferably is 1 millisecond or less, and more preferably is 100 microseconds or less.

A coupling magnetic resonance measurement apparatus may have the configuration illustrated in FIG. 20. The magnetic resonance measurement apparatus in FIG. 20 has two LC resonance circuits, and one circuit (L circuit) that has an inductor but does not have a condenser. One connection point to which both the transmission system and the reception system are connected is provided to the L circuit. The inductors of the three circuits (two LC resonance circuits and one L circuit) are placed in the same orientation (not orthogonal), so that the circuits are magnetically coupled with each other.

A coupling magnetic resonance measurement apparatus may have the configuration illustrated in FIG. 21. The magnetic resonance measurement apparatus in FIG. 21 has two LC resonance circuits, in the same way as in FIG. 18. Note however, that a connection point of the transmission system is provided to one LC resonance circuit, and a connection point of the reception system is provided to the other LC resonance circuit. Note that the connection point of the transmission system and the connection point of the reception system may be individually provided to the same LC resonance circuit.

The operation of the magnetic resonance measurement apparatus in FIG. 21 will be described. When powerful excitation signals are present, the parallel connection assembly operates and is in a shorted state, and accordingly the reception system (connection point of reception system) is also in a shorted state. Accordingly, the powerful excitation signals do not leak to the reception system. Conversely, in the reception mode, the parallel connection assembly behaves as capacitance, and accordingly the reception system can be suitably matched, by the parallel connection assembly alone, by a combination of the parallel connection assembly and other capacitance, and so forth. Thus, in the transmission mode, the reception system can be shorted (protected), and in the reception mode, the reception system can be matched at a suitable resonance frequency.

A switch for switching transmission/reception (also referred to as a duplexer) performs the above switching for protection in a general pulse NMR apparatus. That is to say, pulse NMR apparatuses have a switching switch for connecting one of a transmission system where there is a power amp and so forth, and a reception system where there is a preamp and so forth, to a probe where there is a resonance circuit. Generally, switching of the switch is performed using control signals (active switch), and an extremely complicated circuit is used so as to be able to handle powerful transmission signals and switch transmission/reception at high speeds.

The magnetic resonance measurement apparatus in FIG. 21 can switch between protection and matching without using a switch, and accordingly a circuit for outputting control signals for the switch, and the switch itself, are unnecessary. Further, the transmission energy causing ringing can be transitioned to a different frequency, and accordingly dead time can be shortened as well.

A coupling magnetic resonance measurement apparatus may have the configuration illustrated in FIG. 22. The magnetic resonance measurement apparatus in FIG. 22 has generally the same circuit configuration as that in FIG. 21. However, a parallel connection assembly is further provided to the connection point of the transmission system, and a condenser is further provided to the connection point of the reception system. Providing the parallel connection assembly at the connection point of the transmission system enables the transmission system to be completely isolated from the LC resonance circuit when in the reception mode. Also, further providing the condenser to the connection point of the reception system enables matching adjustment to be performed with even higher precision.

A coupling magnetic resonance measurement apparatus may have the configuration illustrated in FIG. 23. Although a plurality of circuits is magnetically coupled with each other in the magnetic resonance measurement apparatuses in FIGS. 18 and 20 through 22, a plurality of circuits is electrically (capacitively) coupled with each other in the magnetic resonance measurement apparatus in FIG. 23. Specifically, the magnetic resonance measurement apparatus in FIG. 23 has two LC resonance circuits, and one connection point to which both the transmission system and the reception system are connected is provided on one of the LC resonance circuits. The two LC resonance circuits are connected to each other via a condenser, so that the two LC resonance circuits are electrically coupled with each other.

Also, the measurement sample (object) may or may not be provided inside the inductor for transmission/reception of signals with little decay. In a case where the distance between the measurement sample and the inductor is short, transmission and reception of signals therebetween is performed in an oscillating magnetic field state, and not electromagnetic waves.

REFERENCE SIGNS LIST

100 LC resonance circuit (transmission circuit)
101 Inductor
102 Capacitor
103 Parallel connection assembly
103-1, 103-2 Diodes
104 Matching capacitor
200 LC resonance circuit (reception circuit)
300 Magnetic resonance measurement apparatus

The invention claimed is:
1. A magnetic resonance measurement apparatus comprising a first LC circuit configured to form an oscillating magnetic field that causes an object to exhibit magnetic resonance, wherein the first LC circuit includes a parallel connection assembly including a diode,
the parallel connection assembly further includes a diode connected, in parallel and in reverse direction, to the diode,
in a first state in which bias current is not applied to the diode of the parallel connection assembly and oscillating voltage for forming the oscillating magnetic field is applied to the first LC circuit, the diode of the parallel connection assembly functions as a short-circuit such that the resonance frequency of the first LC circuit becomes a first resonance frequency, and
in a second state in which bias current is not applied to the diode of the parallel connection assembly and the oscillating voltage is not applied to the first LC circuit, the diode of the parallel connection assembly functions as capacitance such that the resonance frequency of the first LC circuit becomes a second resonance frequency that is different from the first resonance frequency.

2. The magnetic resonance measurement apparatus according to claim 1, wherein the diode of the parallel connection assembly is a diode, a reverse recovery time of which or a carrier lifetime of which is shorter than a predetermined time.

3. The magnetic resonance measurement apparatus according to claim 2, wherein the diode of the parallel connection assembly is a fast recovery diode.

4. The magnetic resonance measurement apparatus according to claim 2, wherein the predetermined time is 100 microseconds or less.

5. The magnetic resonance measurement apparatus according to claim 4, wherein the predetermined time is 10 microseconds or less.

6. The magnetic resonance measurement apparatus according to claim 1, wherein the diode of the parallel connection assembly is a Schottky barrier diode.

7. The magnetic resonance measurement apparatus according to claim 1, wherein the parallel connection assembly includes two different types of diodes which are connected, in parallel and in reverse direction, to each other.

8. The magnetic resonance measurement apparatus according to claim 7, wherein one of the two diodes is a Schottky barrier diode and the other is a PIN diode.

9. The magnetic resonance measurement apparatus according to claim 1, wherein the parallel connection assembly is provided in a loop-shaped circuit portion including an inductor and a capacitor of the first LC circuit.

10. The magnetic resonance measurement apparatus according to claim 9, wherein the first LC circuit includes:
an inductor;
a capacitor connected in parallel to the inductor; and
the parallel connection assembly connected serially to the inductor or the capacitor.

11. The magnetic resonance measurement apparatus according to claim 10, wherein the first LC circuit further includes a capacitor serially connected to the inductor.

12. The magnetic resonance measurement apparatus according to claim 1, wherein the parallel connection assembly is provided outside of a loop-shaped circuit portion including an inductor and a capacitor of the first LC circuit.

13. The magnetic resonance measurement apparatus according to claim 1, further comprising one or more LC circuits electrically/magnetically coupled with the first LC circuit, wherein
both formation of the oscillating magnetic field and reception of responses of the object relative to the oscillating magnetic field are performed by a plurality of circuits including the first LC circuit and the one or more LC circuits.

14. The magnetic resonance measurement apparatus according to claim 13, wherein a connection point of a transmission system that applies oscillating voltage to form the oscillating magnetic field, and a connection point of a reception system that analyzes electrical signals corresponding to the responses are provided at a same position in one of the plurality of circuits.

15. The magnetic resonance measurement apparatus according to claim 13, wherein, in the plurality of circuits, a circuit at which a connection point of a transmission system that applies oscillating voltage to the plurality of circuits to form the oscillating magnetic field, is provided, is different from a circuit at which a connection point of a reception system that analyzes electrical signals corresponding to the responses is provided.

16. The magnetic resonance measurement apparatus according to claim 13, wherein a connection point of a transmission system that applies oscillating voltage to the plurality of circuits to form the oscillating magnetic field, and a connection point of a reception system that analyzes electrical signals corresponding to the responses are provided at difference places in a same circuit.

17. The magnetic resonance measurement apparatus according to claim 14, wherein, in the first state, the connection point of the reception system enters into a shorted state due to the parallel connection assembly.

18. The magnetic resonance measurement apparatus according to claim 1, further comprising a second LC circuit that receives responses of the object relative to the oscillating magnetic field.

19. The magnetic resonance measurement apparatus according to claim 1, wherein the parallel connection assembly does not include an active element other than the diode connected in parallel.

* * * * *